US010104769B2

(12) United States Patent
Scholz et al.

(10) Patent No.: US 10,104,769 B2
(45) Date of Patent: Oct. 16, 2018

(54) CIRCUIT MATERIALS WITH IMPROVED FIRE RETARDANT SYSTEM AND ARTICLES FORMED THEREFROM

(71) Applicant: Rogers Corporation, Rogers, CT (US)

(72) Inventors: William F. Scholz, Scottsdale, AZ (US); Sankar Paul, Branford, CT (US)

(73) Assignee: ROGERS CORPORATION, Rogers, CT (US)

( * ) Notice: Subject to any disclaimer, the term of this patent is extended or adjusted under 35 U.S.C. 154(b) by 102 days.

(21) Appl. No.: 14/723,734

(22) Filed: May 28, 2015

(65) Prior Publication Data

US 2015/0351237 A1 Dec. 3, 2015

Related U.S. Application Data

(60) Provisional application No. 62/004,334, filed on May 29, 2014.

(51) Int. Cl.
*H05K 1/03* (2006.01)
*H05K 3/46* (2006.01)
*C08K 5/53* (2006.01)
*C08K 5/5313* (2006.01)

(52) U.S. Cl.
CPC ......... *H05K 1/0373* (2013.01); *C08K 5/5313* (2013.01); *H05K 3/4655* (2013.01); *H05K 2201/012* (2013.01); *H05K 2201/0195* (2013.01); *Y10T 156/10* (2015.01); *Y10T 428/2495* (2015.01); *Y10T 428/24355* (2015.01); *Y10T 428/24917* (2015.01)

(58) Field of Classification Search
CPC ............... H05K 1/0373; H05K 3/4655; H05K 2201/012; C08K 5/5313
See application file for complete search history.

(56) References Cited

U.S. PATENT DOCUMENTS

| 6,291,627 | B1 | 9/2001 | Wang et al. | |
|---|---|---|---|---|
| 6,524,709 | B1 | 2/2003 | Sagara et al. | |
| 7,022,404 | B2* | 4/2006 | Sethumadhavan | B32B 27/04 174/258 |
| 7,790,268 | B2 | 9/2010 | Kennedy | |
| 8,431,222 | B2 | 4/2013 | Paul | |
| 2003/0141014 | A1* | 7/2003 | Satoyuki | C09J 7/00 156/326 |
| 2005/0038278 | A1* | 2/2005 | Dittrich | C07F 9/657181 558/97 |
| 2005/0038279 | A1* | 2/2005 | Dittrich | C07F 9/4841 558/97 |
| 2005/0202261 | A1* | 9/2005 | Takai | H05K 3/386 428/458 |
| 2007/0221890 | A1* | 9/2007 | Gan | C07F 9/657172 252/601 |
| 2011/0214906 | A1* | 9/2011 | Baars | B05D 5/12 174/257 |
| 2011/0294920 | A1* | 12/2011 | Fuchs | C08K 3/32 523/451 |
| 2012/0006588 | A1* | 1/2012 | Kakiuchi | B32B 27/38 174/258 |
| 2012/0053265 | A1* | 3/2012 | Angell | C07F 9/657172 523/451 |
| 2012/0055705 | A1* | 3/2012 | White | C07F 9/657172 174/259 |
| 2012/0322923 | A1* | 12/2012 | Wermter | C08K 5/0066 524/100 |
| 2013/0018128 | A1* | 1/2013 | Yao | C07F 9/657172 523/451 |
| 2013/0266779 | A1* | 10/2013 | Tokiwa | H05K 1/0373 428/195.1 |
| 2014/0004324 | A1* | 1/2014 | Hsieh | C08L 71/123 428/209 |
| 2014/0011962 | A1* | 1/2014 | He | C09D 147/00 525/375 |
| 2014/0113118 | A1* | 4/2014 | Wang | C08L 71/126 428/209 |
| 2014/0148556 | A1* | 5/2014 | Meng | C08G 65/48 525/390 |
| 2014/0154939 | A1* | 6/2014 | Rong | C08G 59/34 442/59 |
| 2014/0349090 | A1* | 11/2014 | Hsieh | C08L 71/12 428/209 |
| 2015/0030824 | A1* | 1/2015 | Crosley | H05K 1/0373 428/206 |

(Continued)

FOREIGN PATENT DOCUMENTS

| EP | 2291061 A2 | 3/2011 |
|---|---|---|
| WO | 2003036968 A1 | 5/2003 |
| WO | 2010135393 A1 | 11/2010 |
| WO | 2010135398 A1 | 11/2010 |
| WO | 2011123389 A1 | 10/2011 |

OTHER PUBLICATIONS

International Search Report of the International Searching Authority for International Application No. PCT/US2016/063026; dated Mar. 2, 2017; Date of Mailing: Mar. 16, 2017; 6 Pages.
Written Opinion of the International Searching Authority for International Application No. PCT/US2016/063026; International Filing dated Nov. 21, 2016; 7 Pages.

(Continued)

*Primary Examiner* — Liam J Heincer
(74) *Attorney, Agent, or Firm* — Cantor Colburn LLP

(57) ABSTRACT

A circuit subassembly, comprising a conductive layer, a dielectric layer is formed from a thermosetting composition, wherein the thermosetting composition comprises, based on the total weight of the thermosetting composition, a low polarity resin, a oxaphosphorinoxide-containing aromatic compound, and an protective adhesive layer disposed between the conductive layer and the dielectric layer, wherein the circuit subassembly has a UL-94 rating of at least V-0. Also disclosed is a composition for a bond ply and a circuit subassembly that further comprises such bond ply.

17 Claims, 3 Drawing Sheets

(56) References Cited

U.S. PATENT DOCUMENTS

| | | | |
|---|---|---|---|
| 2015/0148450 A1* | 5/2015 | Tang | C08L 63/00 |
| | | | 523/433 |
| 2015/0183976 A1* | 7/2015 | Banda | C08J 3/005 |
| | | | 428/195.1 |
| 2015/0296614 A1* | 10/2015 | Williams | H05K 3/022 |
| | | | 428/195.1 |
| 2016/0021739 A1* | 1/2016 | Li | B32B 5/022 |
| | | | 428/195.1 |
| 2016/0021740 A1* | 1/2016 | Li | H05K 1/0373 |
| | | | 428/195.1 |
| 2016/0060281 A1* | 3/2016 | Angell | C07F 9/657172 |
| | | | 524/119 |
| 2016/0129666 A1* | 5/2016 | Hsieh | B32B 5/02 |
| | | | 442/141 |
| 2016/0222204 A1* | 8/2016 | Wang | B32B 15/092 |
| 2017/0145266 A1 | 5/2017 | Scholz | |

* cited by examiner

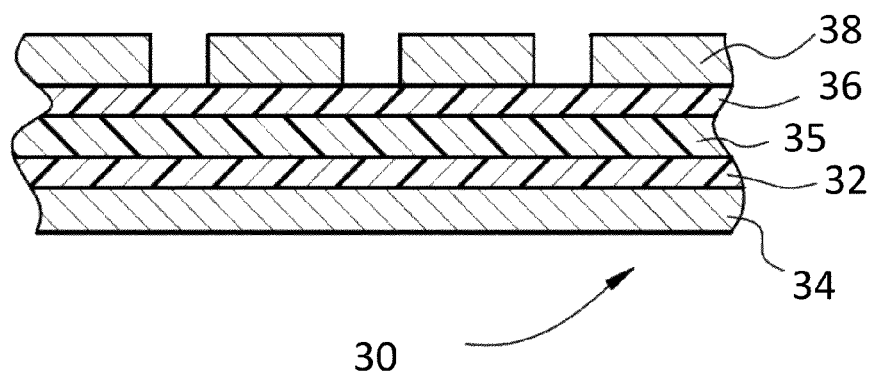
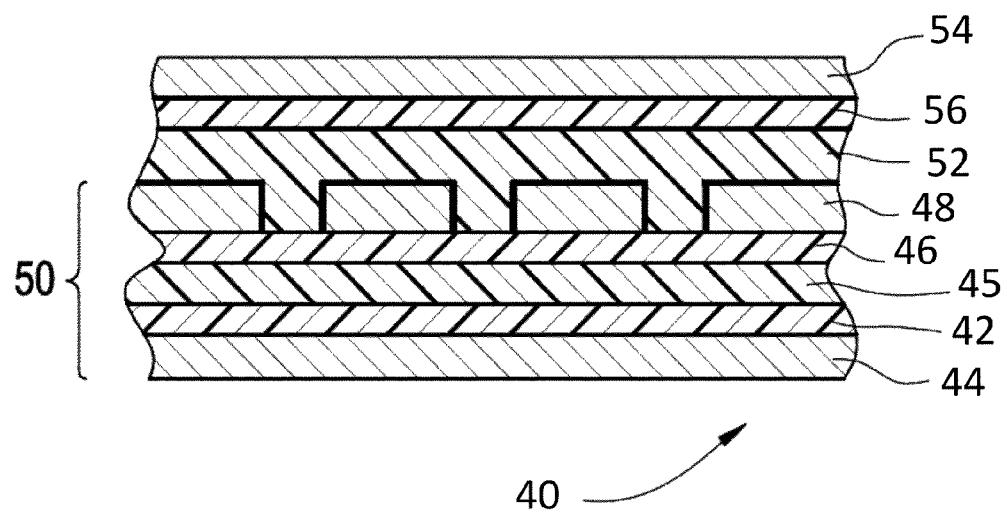

CIRCUIT MATERIALS WITH IMPROVED FIRE RETARDANT SYSTEM AND ARTICLES FORMED THEREFROM

CROSS REFERENCE TO RELATED APPLICATIONS

This application claims the benefit of U.S. Provisional Application No. 62/004,334, filed May 29, 2014, which is incorporated by reference in its entirety herein.

BACKGROUND

This invention generally relates to circuit subassemblies, methods of manufacture of the circuit subassemblies, and articles formed therefrom, including circuits and multilayer circuits.

As used herein, a circuit subassembly is an article used in the manufacture of circuits and multilayer circuits, and includes circuit laminates, packaging substrate laminates, build-up materials, bond plies, resin coated conductive layers, and cover films. A circuit laminate is a type of circuit subassembly that has a conductive layer, e.g., copper, fixedly attached to a dielectric substrate layer. Double clad laminates have two conductive layers, one on each side of the dielectric layer. Patterning a conductive layer of a laminate, for example by etching, provides a circuit. Multilayer circuits comprise a plurality of conductive layers, at least one of which contains a conductive wiring pattern. Typically, multilayer circuits are formed by laminating two or more materials together, at least one of which contains a circuit layer, using bond plies, in proper alignment using heat and/or pressure.

In use, a bond ply, or portions thereof, can flow and completely fill the space and provide adhesion between circuits, between a circuit and a conductive layer, between two conductive layers, or between a circuit and a dielectric layer. Thus, one or more of the polymers in a bond ply is designed to soften or flow during manufacture of the multilayer circuit but not in use of the circuit. In multilayer structures, after lamination, known hole-forming and plating technologies may be used to produce useful electrical pathways between conductive layers.

The optimum design of a bond ply for such applications would be a structure in which the composition of the bond ply is homogeneous throughout and has the same electrical, thermal, and mechanical properties (including low dielectric constant and low dissipation factor) as for the copper clad laminate. A bond ply used in the formation of rigid circuit laminates, multilayer circuits, and subassemblies, can also comprise a glass fabric saturated with an uncured or B-staged polymer composition, which cures in the circuit or subassembly lamination process. The glass fabric can provide a hard stop to prevent conductors on opposing layers from coming too close to each other causing low resistance or other problems.

Because bond plies, dielectric layers, and other circuit subassembly materials can contain synthetic organic materials having high carbon and hydrogen contents, they can be combustible. Many applications, however, demand that they meet flame retardancy requirements such as mandated in the building, electrical, transportation, mining and automotive industries. To meet these demands, circuit materials have included additives intended to interfere in various ways with the chemical exothermic chain of combustion.

In particular, compositions for circuit subassemblies have used halogenated, specifically brominated, flame retardant additives to achieve necessary levels of flame retardancy. In recent years, however, brominated flame retardants have come under increased scrutiny for their potential to contribute to health and environmental problems. There have been worldwide health and environmental concerns regarding brominated compounds because of their alleged potential to yield toxic by-products when burned or when disposed in landfills.

These concerns have spurred desires for 'halogen-free' circuit materials that have a UL94 flame retardance rating of V-1 or better, especially without bromine or chlorine. Some governmental or other groups have proposed that the specification for 'halogen-free' in a circuit material be less than 900 parts per million (ppm) of bromine, chlorine, or a combination thereof.

On the other hand, flame retardant additives that do not contain halogen can have serious drawbacks if used in circuit subassemblies, either because of their inherent properties or because they are less effective as flame retardants. The former drawback can lead to poor electrical properties, decreased thermal stability, and increased water absorption. The latter drawback might be overcome by use of very high loadings, but this can lead to deterioration of physical and/or electrical properties. Examples of alternative flame retardants that can cause such problems are some phosphorous compounds, aluminum trihydrate, borates, and the like. Also, some phosphorous or phosphinate based flame retardants are known to cause reduced copper peel strength, particularly with lower dielectric loss ($D_f$) core laminates.

It has, therefore, become highly desirable to develop a circuit subassembly that comprises an effective flame retardant, yet that contains essentially no halogens, especially bromine and chlorine. Consequently, a variety of organic phosphorous-containing compounds have been proposed or used as fire retardants in otherwise flammable resin compositions, because of their being perceived as more environmentally friendly. The compound's mechanism of action may be different than inorganic phosphorous-containing compounds, since the phosphorous content is significantly less, typically less than about 5-15 wt. %.

In particular, organo-phosphorous flame retardants with reactive groups (active hydrogens), such as those derived from 9,10-dihydro-9-oxa-10-phosphaphenantrene-10-oxide ("DOPO"), have been used in epoxy resin formulations and laminates. Such flame retardants are believed to react with the epoxy to form a phosphorus-modified epoxy resin. For example, US 2010/0234495 discloses the use of a mono-DOPO compound (having a single oxaphosphorinoxide group) and derivatives with other compounds. A salt of phosphinic acid is used as a synergist, and the exemplary compositions include a nitrogen-containing compound that is aminouracil. The amount of the DOPO compound in the examples is at most 7.5%. This reference discloses application to molded articles comprising various polymers, including molded articles comprising poybutadiene resins.

Several prior art references disclose the use of a DOPO compound (DOPO or a derivative thereof) in an epoxy-containing resin composition, apparently involving a reaction between epoxy groups in the resin and an active hydrogen in the DOPO compound. Prior art references showing such a combination include, for example, U.S. Pat. No. 6,291,627 (National Science Council in Taiwan), WO 2010/135393 (Abermarle), U.S. Pat. No. 6,524,709 (Matsushita), and US 2011/0054079 (Dow).

More recently, DOPO-derived flame retardants that do not have active hydrogen groups have been disclosed for use in various formulations, particularly as disclosed in WO 2011/

123389 A1 and WO 2010/135398 A1. Working examples of DOPO-derived fire-retardants in combination with other than epoxy-containing resins formulations, however, have been lacking.

In the art of circuit laminates, epoxy-resin-based compositions for use in dielectric substrates are generally considered to be polar materials, which can be undesirable for circuit applications operating at high frequency or at high data speeds. High polarity can result in unacceptably high dielectric loss and/or other adverse effects.

Accordingly, there is a need for thermosetting compositions, especially otherwise highly flammable low polarity compositions, that contain an essentially non-halogen-containing fire retardant compound for providing effective flame retardant properties in a circuit subassembly without impairing physical properties or electrical properties, for example $D_f$ and moisture absorption properties. Finally, the fire retardant compound must be able to withstand the processing conditions of the circuit material, which can involve high temperatures and exposure to acid and/or alkali (low and/or high pH) solutions.

SUMMARY OF INVENTION

A circuit subassembly is disclosed comprising:

a conductive metal layer;

a dielectric substrate layer formed from a thermosetting composition, wherein the thermosetting composition comprises:

a thermosetting resin having an LOI of less than 20 and comprising at least two free-radically reactive functional groups;

greater than 95 parts per hundred resin of an oxaphosphorinoxide-containing aromatic compound having a peak melting point of at least about 260° C.; and 30 to 70 weight percent of inorganic filler, wherein the inorganic filler plus oxaphosphorinoxide-containing aromatic compound, in total, is present at 55 to less than 65 volume percent, based on the total volume of the thermosetting composition; and a protective adhesive layer, having a thickness less than 20 percent of said dielectric substrate layer, directly disposed between the conductive metal layer and the dielectric substrate layer, wherein the composition of the protective adhesive layer comprises less than 20 weight percent filler;

wherein the circuit subassembly has a UL-94 rating of at least V-1, a $D_f$ of less than 0.006 at 10 GHz and a $D_k$ of less than 3.8 at 10 GHz.

In another embodiment a circuit subassembly comprises a circuit subassembly, comprising:

a conductive metal layer having an RMS surface roughness that is greater than about 1 micrometer;

a dielectric substrate layer formed from a thermosetting composition, wherein the thermosetting composition comprises:

a polybutadiene or polyisoprene resin in an amount or 10 to greater than 50 wt. % of the total resin;

greater than 95 parts per hundred resin of an oxaphosphorinoxide-containing aromatic compound having a peak melting point of at least about 260° C. represented by the following structure:

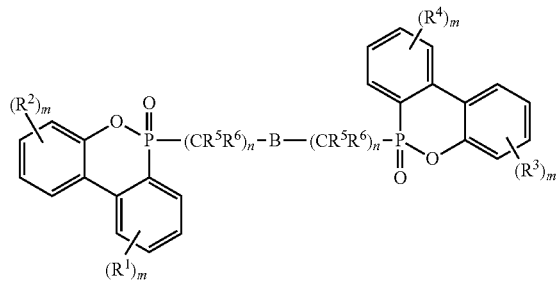

wherein B is a direct bond, $C_6$-$C_{12}$ aryl, $C_3$-$C_{12}$ cycloalkyl, or a $C_3$-$C_{12}$ cycloalkenyl, wherein said cycloalkyl or cycloalkenyl may be optionally substituted by a $C_1$-$C_6$ alkyl; each $R^1$, $R^2$, $R^3$ and $R^4$ are independently hydrogen, $C_1$-$C_{15}$ alkyl, $C_6$-$C_{12}$ aryl, $C_7$-$C_{15}$ aralkyl or $C_7$-$C_{15}$ alkaryl; or $R^1$ and $R^2$ or $R^3$ and $R^4$ taken together can form a saturated or unsaturated cyclic ring, wherein said saturated or unsaturated cyclic ring can be optionally substituted by a $C_1$-$C_6$ alkyl; each m is independently 1, 2, 3 or 4; each $R^5$ and $R^6$ are independently hydrogen or a $C_1$-$C_6$ alkyl; and each n is independently 0, 1, 2, 3, 4 or 5; with the proviso that when B is aryl or a direct bond, n cannot be 0; and 30 to 70 weight percent of inorganic filler, wherein the inorganic filler plus oxaphosphorinoxide-containing aromatic compound, in total, is present at 55 to less than 65 volume percent, based on the total volume of the thermosetting composition;

and a protective adhesive layer, directly disposed between the conductive metal layer and the dielectric substrate layer, having a thickness less than 20 percent of said dielectric substrate layer, wherein the composition of the protective adhesive layer comprises poly(phenylene ether) and 0 to 10 weight percent filler;

wherein the circuit subassembly has a UL-94 rating of at least V-1, a $D_f$ of less than 0.006 at 10 GHz and a $D_k$ of less than 3.8 at 10 GHz.

In another embodiment a circuit subassembly comprises:

a conductive metal layer;

a dielectric substrate layer formed from a thermosetting composition, wherein the thermosetting composition comprises, based on the total weight of the thermosetting composition:

10 to 35 wt. % of a polybutadiene or polyisoprene resin;

10 to 35 wt. %, and greater than 95 parts per hundred resin, of an oxaphosphorinoxide-containing aromatic compound having a peak melting point of at least about 260° C. represented by the following structure:

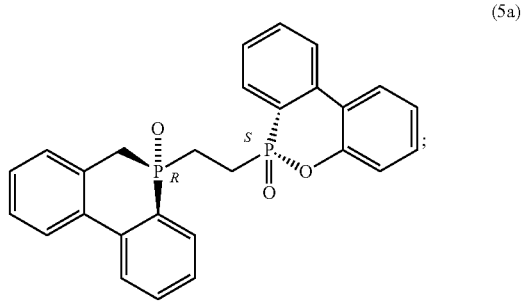

and 30 to 70 weight percent of inorganic filler, wherein the inorganic filler plus oxaphosphorinoxide-containing aromatic compound, in total, is present at 55 to less than 65 volume percent, based on the total volume of the thermosetting composition;

and a protective adhesive layer having a thickness less than 15 percent of said dielectric layer, wherein the composition of the protective adhesive layer comprises poly(phenylene ether) and less than 15 weight percent inorganic filler;

wherein the circuit subassembly has a UL-94 rating of at least V-1, a $D_f$ of less than 0.006 at 10 GHz and a $D_k$ of less than 3.8 at 10 GHz.

Another embodiment is directed to a circuit subassembly, comprising at least two circuit laminates, each comprising:

a conductive metal layer, wherein at least one of the conductive metal layers of each circuit laminate has been patterned to form a circuit;

a dielectric substrate layer formed from a thermosetting composition, wherein the thermosetting composition comprises:

a thermosetting resin having an LOI of less than 20 and comprising at least two free-radically reactive functional groups;

greater than 95 parts per hundred resin of an oxaphosphorinoxide-containing aromatic compound having a peak melting point of at least about 260° C.; and 30 to 70 weight percent of inorganic filler, wherein the inorganic filler plus oxaphosphorinoxide-containing aromatic compound, in total, is present at 55 to less than 65 volume percent, based on the total volume of the thermosetting composition;

wherein a protective adhesive layer, having a thickness less than 15 percent of said dielectric layer, is disposed between each conductive metal layer and its dielectric substrate layer in each of the at least two circuit laminates;

a bond ply layer disposed between said two circuit laminates wherein the bond ply layer is in direct contact with at least one circuit or conductive layer in at least one of said two circuit laminates, wherein the composition of the bond ply layer comprises said oxaphosphorinoxide-containing aromatic compound in an amount of 20 to 40 weight percent and filler in an amount that is 10 to 30 volume percent; and wherein the circuit subassembly has a UL-94 rating of at least V-1, a $D_f$ of less than 0.006 at 10 GHz and a $D_k$ of less than 3.8 at 10 GHz.

Another embodiment is directed to a circuit subassembly, comprising:

at least two circuit laminates, each comprising:

a conductive metal layer, wherein at least one of the conductive metal layers of each circuit laminate has been patterned to form a circuit;

a dielectric substrate layer formed from a thermosetting composition, wherein the thermosetting composition comprises, based on the total weight of the thermosetting composition:

10 to 35 wt. % of a polybutadiene and/or polyisoprene resin;

10 to 35 wt. %, and greater than 95 parts per hundred resin, of an oxaphosphorinoxide-containing aromatic compound having a peak melting point of at least about 260° C., represented by the following structure:

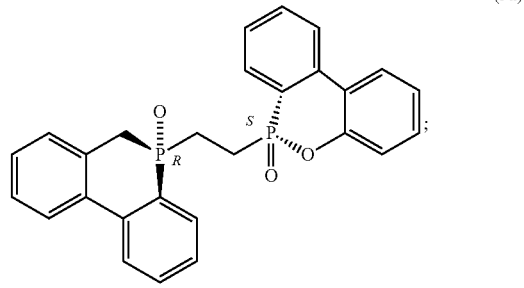

(5a)

and 30 to 70 weight percent of inorganic filler, wherein the inorganic filler plus oxaphosphorinoxide-containing aromatic compound, in total, is present at 55 to less than 65 volume percent, based on the total volume of the thermosetting composition;

wherein each circuit laminate comprises a protective adhesive layer, having a thickness less than 15 percent of said dielectric layer, directly disposed between each conductive metal layer and its dielectric substrate layer in the at least two circuit laminates, a bond ply layer disposed between the at least two circuit laminates wherein the bond ply is in direct contact with at least one circuit or conductive layer in the at least two circuit laminates;

wherein the composition of the bond ply layer comprises said oxaphosphorinoxide-containing aromatic compound in an amount of 20 to 40 weight percent and filler in an amount that is 10 to 30 volume percent; and wherein the circuit subassembly has a UL-94 rating of at least V-1, a $D_f$ of less than 0.006 at 10 GHz and a $D_k$ of less than 3.8 at 10 GHz.

Another embodiment is directed to a bond ply layer, having a thickness of 50 to 400 micrometers, the composition of which comprises:

greater than 27 volume percent of liquid resin;

20 to 40 weight percent of oxaphosphorinoxide-containing aromatic compound having a peak melting point of at least about 260° C.; and 10 to 30 volume percent inorganic filler;

wherein the bond ply has a UL-94 rating of at least V-1, a $D_f$ of less than 0.006 at 10 GHz and a $D_k$ of less than 3.8 at 10 GHz.

Yet another embodiment is directed to a bond ply layer, having a thickness of 50 to 400 micrometers, comprising greater than 27 volume percent of liquid resin, which liquid resin comprises a poly(arylene ether) and polybutadiene; 20 to 40 weight percent of an oxaphosphorinoxide-containing aromatic compound having a peak melting point of at least about 260° C., represented by the following structure:

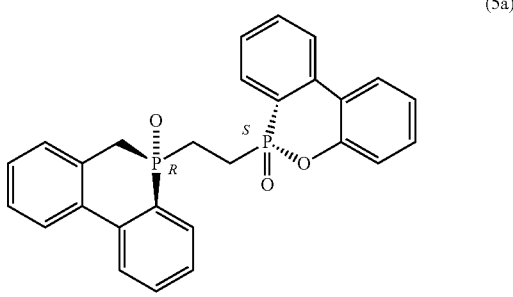

(5a)

and about 6 to about 20 percent by weight of a nitrogen-containing compound, based on the weight of the thermosetting composition, wherein the nitrogen-containing organic compound is reactive with the poly(arylene ether) and/or polyisoprene; and 20 to 40 weight percent and 10 to 30 volume percent of inorganic filler, wherein the circuit subassembly has a UL-94 rating of at least V-1, a $D_f$ of less than 0.006 at 10 GHz and a $D_k$ of less than 3.8 at 10 GHz.

Still other aspects of the invention are directed to a printed wiring board formed from the above-described circuit subassemblies and to a method for the manufacture of the circuit subassemblies. The invention is further illustrated by the following drawings, detailed description, and examples.

BRIEF DESCRIPTION OF DRAWINGS

Referring now to the schematic representations of exemplary circuit subassemblies:

FIG. 3 shows an exemplary double clad circuit in which one of the two conductive layers have been patterned.

FIG. 4 shows an exemplary multilayer circuit comprising a plurality of conductive layers, dielectric layers, and protective adhesive layers.

DETAILED DESCRIPTION

Figure 1:
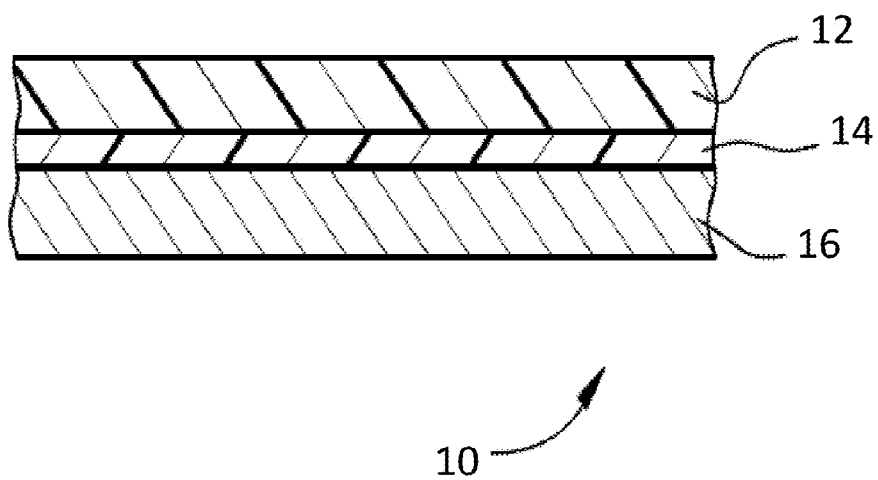
FIG. 1 shows an exemplary circuit laminate comprising a dielectric layer, a protective adhesive layer, and a conductive layer.

As used herein, the term "hydrocarbyl" refers broadly to a substituent comprising carbon and hydrogen, optionally with 1 to 3 heteroatoms, for example, oxygen, nitrogen, halogen, silicon, or sulfur; "alkyl" refers to a straight or branched chain monovalent hydrocarbon group; "alkylene" refers to a straight or branched chain divalent hydrocarbon group; "alkylidene" refers to a straight or branched chain divalent hydrocarbon group, with both valences on a single common carbon atom; "alkenyl" refers to a straight or branched chain monovalent hydrocarbon group having at least two carbons joined by a carbon-carbon double bond; "cycloalkyl" refers to a non-aromatic monovalent monocyclic or multicylic hydrocarbon group having at least three carbon atoms, "cycloalkenyl" refers to a non-aromatic cyclic divalent hydrocarbon group having at least three carbon atoms, with at least one degree of unsaturation; "aryl" refers to an aromatic monovalent group containing only carbon in the aromatic ring or rings; "arylene" refers to an aromatic divalent group containing only carbon in the aromatic ring or rings; "alkylaryl" refers to an aryl group that has been substituted with an alkyl group as defined above, with 4-methylphenyl being an exemplary alkylaryl group; "arylalkyl" refers to an alkyl group that has been substituted with an aryl group as defined above, with benzyl being an exemplary arylalkyl group; "acyl" refers to an alkyl group as defined above with the indicated number of carbon atoms attached through a carbonyl carbon bridge (—C(=O)—); "alkoxy" refers to an alkyl group as defined above with the indicated number of carbon atoms attached through an oxygen bridge (—O—); and "aryloxy" refers to an aryl group as defined above with the indicated number of carbon atoms attached through an oxygen bridge (—O—).

Unless otherwise indicated, each of the foregoing groups can be unsubstituted or substituted, provided that the substitution does not significantly adversely affect synthesis, stability, or use of the compound. The term "substituted" as used herein means that at least one hydrogen on the designated atom or group is replaced with another group, provided that the designated atom's normal valence is not exceeded. When the substituent is oxo (i.e., =O), then two hydrogens on the atom are replaced. Combinations of substituents and/or variables are permissible provided that the substitutions do not significantly adversely affect synthesis or use of the compound.

Exemplary groups that can be present on a "substituted" position include, but are not limited to, halogen; cyano; hydroxyl; nitro; azido; alkanoyl (such as a C2-C6 alkanoyl group such as acyl or the like); carboxamido; alkyl groups (typically having 1 to about 8 carbon atoms, or 1 to about 6 carbon atoms); cycloalkyl groups, alkenyl and alkynyl groups (including groups having at least one unsaturated linkages and from 2 to about 8, or 2 to about 6 carbon atoms); alkoxy groups having at least one oxygen linkage and from 1 to about 8, or from 1 to about 6 carbon atoms; aryloxy such as phenoxy; alkylthio groups including those having at least one thioether linkage and from 1 to about 8 carbon atoms, or from 1 to about 6 carbon atoms; alkylsulfinyl groups including those having at least one sulfinyl linkage and from 1 to about 8 carbon atoms, or from 1 to about 6 carbon atoms; alkylsulfonyl groups including those having at least one sulfonyl linkage and from 1 to about 8 carbon atoms, or from 1 to about 6 carbon atoms; aminoalkyl groups including groups having at least one N atom and from 1 to about 8, or from 1 to about 6 carbon atoms; aryl having 6 or more carbons and at least one ring, (e.g., phenyl, biphenyl, naphthyl, or the like, each ring either substituted or unsubstituted aromatic); arylalkyl having 1 to 3 separate or fused rings and from 6 to about 18 ring carbon atoms, with benzyl being an exemplary arylalkyl group; or arylalkoxy having 1 to 3 separate or fused rings and from 6 to about 18 ring carbon atoms, with benzyloxy being an exemplary arylalkoxy group.

Unless otherwise indicated, all the foregoing groups derived from hydrocarbons may have up to about 1 to about 20 carbon atoms (e.g., $C_1$-$C_{20}$ alkyl, $C_6$-$C_{20}$ aryl, $C_7$-$C_{20}$ alkaryl, $C_7$-$C_{20}$ aralkyl) or 1 to about 12 carbon atoms (e.g., $C_1$-$C_{12}$ alkyl, $C_6$-$C_{12}$ aryl, $C_7$-$C_{12}$ alkaryl, $C_7$-$C_{12}$ aralkyl), or 1 to about 8 carbon atoms, or 1 to about 6 carbon atoms.

As indicated previously, circuit subassemblies disclosed herein comprise polymer systems with halogen-free fire retardant additives, which achieve UL94 flame retardance rating of V-1 or better (V-1 or V-0) while also giving excellent electrical properties, low water absorption, and excellent resistance to the solvents and solutions, especially the highly acidic and/or basic ones used in conventional circuit fabrication. These properties are all highly desired in circuit subassemblies for use in high frequency or high data speed applications.

UL94 is an Underwriters Laboratories flammability test that provides four possible ratings, HB, V-2, V-1, and V-0. V-0 is the most difficult rating to obtain, requiring that five bars of material self-extinguish with an average flame out time of ten seconds or less without dripping.

Regarding electrical properties, the dielectric layer disclosed herein, or circuit subassemblies made therefrom, can have a $D_f$ (dissipation factor) of less than 0.006 at 10 GHz and a $D_k$ (dielectric constant) of less than 3.8 at 10 GHz. $D_f$ is a measure of loss-rate of electrical potential energy in a dielectric material, usually in the form of heat. Thus, $D_f$ determines the "lossiness" of a material. A low dielectric loss is desired for high-speed interconnects and operation at high frequencies in a printed circuit assembly.

The thermosetting composition for the dielectric substrate layer in a circuit subassembly is a low polarity composition (inclusive of non-polar compositions). Thus, substantial amounts of epoxy-containing resins are excluded, specifically absent. While the thermosetting composition is a low polarity, low dielectric constant, and low loss material, it may tend, however, to be highly flammable when formulated without flame retardant additives. In one embodiment, the thermosetting composition is based on a thermosetting resin that has an LOI (limited oxygen index) of less than 20 and comprises at least two (specifically, on average, two or more) free-radically reactive functional groups, specifically groups having an ethylenically unsaturated double bond. The thermosetting composition can have a combined bromine and chlorine content of less than about 900 ppm.

Examples of thermosetting compositions include those based on thermosetting resins such as 1,2-polybutadiene, polyisoprene, polybutadiene-polyisoprene copolymers, poly(phenylene ether) resins, curable cyclic olefins or their copolymers (such as the copolymers described in US patent publications 2008/0259234 and 2011/0060096), hereby incorporated by reference in their entirety. The thermosetting resin can be functionalized with a reactant compound to contain ethylenically unsaturated double bonds. For example, the thermosetting resin can be vinylated, allylated, methacrylated, or maleinated to comprise free-radically reactive ethylenically unsaturated double bonds. In one embodiment, the thermosetting composition is based on a vinyl-terminated polybutadiene and/or a vinyl or allyl terminated poly(phenylene ether). The vinyl or allyl terminated poly(phenylene ether) can have a number average molecular weight of less than 4,000. Such low molecular weight vinyl or allyl terminated poly(phenylene ether) resin is commercially available from Mitsubishi Gas under the trade name of MGC OPE-2St, from Sabic Innovative Plastics under the trade names of SA120 and SA5587, Xyron®-modified polymers from Asahi Kasei, and from Nisso America, Inc. under the trade name B3000 or B1000. Still other co-curable polymers that can be added for specific property or processing modifications include, but are not limited to, homopolymers or copolymers of ethylene such as polyethylene and ethylene oxide copolymers; methacrylated PPO (polyphenylene oxide) resins such as SA9000, which is reactive with polybutadiene in the same composition; natural rubber; norbornene polymers such as polydicyclopentadiene; hydrogenated styrene-isoprene-styrene copolymers and butadiene-acrylonitrile copolymers; unsaturated polyesters; and the like. Levels of these copolymers are generally less than 50 vol. % of the resin system.

Such thermosetting resins can exhibit the desirable features of low dielectric constant and low loss. Combinations of low polarity resins with minor amounts of higher polarity resins can also be used, non-limiting examples including epoxy and poly(phenylene ether), and cyanate ester and poly(phenylene ether). Compositions based on polybutadiene, polyisoprene, and/or butadiene- and isoprene-containing copolymers are especially useful. To state that a thermosetting composition is "based on" one or more thermosetting resins means that the thermosetting composition comprises more of that thermosetting resin than any other resin, specifically greater than 50 wt. % of the total resin (including reaction monomers and oligomers, exclusive of filler) used to make the dielectric substrate, including reactive monomers.

Particularly suitable thermosetting compositions comprise, or are based on, thermosetting polybutadiene and/or polyisoprene resin. As used herein, the term "thermosetting polybutadiene and/or polyisoprene resin" includes homopolymers and copolymers comprising units derived from butadiene, isoprene, or mixtures thereof. Units derived from other copolymerizable monomers can also be present in the resin, for example in the form of grafts. Exemplary copolymerizable monomers include, but are not limited to, vinylaromatic monomers, for example substituted and unsubstituted monovinylaromatic monomers such as styrene, 3-methylstyrene, 3,5-diethylstyrene, 4-n-propylstyrene, alpha-methylstyrene, alpha-methyl vinyltoluene, para-hydroxystyrene, para-methoxystyrene, alpha-chlorostyrene, alpha-bromostyrene, dichlorostyrene, dibromostyrene, tetrachlorostyrene, and the like; and substituted and unsubstituted divinylaromatic monomers such as divinylbenzene, divinyltoluene, and the like. Combinations comprising at least one of the foregoing copolymerizable monomers can also be used. Exemplary thermosetting polybutadiene and/or polyisoprene resins include, but are not limited to, butadiene homopolymers, isoprene homopolymers, butadiene-vinylaromatic copolymers such as butadiene-styrene, isoprene-vinylaromatic copolymers such as isoprene-styrene copolymers, and the like.

The thermosetting polybutadiene and/or polyisoprene resins can also be modified, for example the resins can be hydroxyl-terminated, methacrylate-terminated, and/or carboxylate-terminated resins. Post-reacted resins can be used, such as epoxy-, maleic anhydride-, or urethane-modified butadiene or isoprene resins. The resins can also be crosslinked, for example by divinylaromatic compounds such as divinyl benzene, e.g., a polybutadiene-styrene crosslinked with divinyl benzene. Suitable resins are broadly classified as "polybutadienes" by their manufacturers, for example Nippon Soda Co., Tokyo, Japan, and Cray Valley Hydrocarbon Specialty Chemicals, Exton, Pa. Mixtures of resins can also be used, for example, a mixture of a polybutadiene homopolymer and a poly(butadiene-isoprene) copolymer. Combinations comprising a syndiotactic polybutadiene can also be used.

The thermosetting polybutadiene and/or polyisoprene resin can be liquid or solid at room temperature. Suitable liquid resins can have a number average molecular weight greater than about 5,000 but generally have a number average molecular weight of less than about 5,000 (most preferably about 1,000 to about 3,000). Thermosetting polybutadiene and/or polyisoprene resins having at least 90 wt. % 1,2 additions are preferred because they exhibit the greatest crosslink density upon cure, due to the large number of pendent vinyl groups available for crosslinking.

The thermosetting resin, specifically the polybutadiene and/or polyisoprene resin, can be present in the resin system of the dielectric substrate layer in an amount of 50 to 100 wt. %, specifically about 60 to 90 wt. % based on total resin, optionally in combination with up to 30 wt. %, specifically up to 15 wt. % based on total resin of compounds selected from the group consisting of bis(vinyl phenyl) methane, bis(vinyl phenyl)ethane, bis(vinyl phenyl) hexane, and combinations thereof. Alternatively, the polybutadiene and/or polyisoprene resin can be present in an amount, based on the thermosetting composition (including filler) of about 10 to about 55 wt. %, more specifically about 15 to about 45 wt. %. Other polymers or compounds that can co-cure with the thermosetting polybutadiene and/or polyisoprene resins can be added for specific property or processing modifications. For example, in order to improve the stability of the dielectric strength and mechanical properties of the electrical substrate material over time, a lower molecular weight ethylene propylene elastomer can be used in the resin systems. An ethylene propylene elastomer as used herein is a copolymer, terpolymer, or other polymer comprising primarily ethylene and propylene. Ethylene propylene elastomers can be further classified as EPM copolymers (i.e., copolymers of ethylene and propylene monomers) or EPDM terpolymers (i.e., terpolymers of ethylene, propylene, and diene monomers). Ethylene propylene diene terpolymer rubbers, in particular, have saturated main chains, with unsaturation available off the main chain for facile crosslinking. Liquid ethylene propylene diene terpolymer rubbers, in which the diene is dicyclopentadiene, are preferred.

Useful molecular weights of the ethylene propylene rubbers are less than 10,000 viscosity average molecular weight. Suitable ethylene propylene rubbers include an ethylene propylene rubber having a viscosity average molecular weight (MV) of about 7,200, which is available from Lion Copolymer, Baton Rouge, La., under the trade name TRILENE CP80; a liquid ethylene propylene dicyclopentadiene terpolymer rubber having a molecular weight of about 7,000, which is available from Lion Copolymer under the trade name of TRILENE 65; and a liquid ethylene propylene ethylidene norbornene terpolymer, having a molecular weight of about 7,500, which is available from Uniroyal Chemical Co. under the name TRILENE 67.

The ethylene propylene rubber is preferably present in an amount effective to maintain the stability of the properties of the substrate material over time, in particular the dielectric strength and mechanical properties. Typically, such amounts are up to about 20 wt. % with respect to the total weight of the total resin ("resin system"), more specifically about 4 to about 20 wt. %, even more specifically about 6 to about 12 wt. %.

Another type of co-curable polymer is an unsaturated polybutadiene- or polyisoprene-containing elastomer. This component can be a random or block copolymer of primarily 1,3-addition butadiene or isoprene with an ethylenically unsaturated monomer, for example a vinylaromatic compound such as styrene or alpha-methyl styrene, an acrylate or methacrylate such as methyl methacrylate, or acrylonitrile. The elastomer is preferably a solid, thermoplastic elastomer comprising a linear or graft-type block copolymer having a polybutadiene or polyisoprene block, and a thermoplastic block that preferably is derived from a monovinylaromatic monomer such as styrene or alpha-methyl styrene. Suitable block copolymers of this type include styrene-butadiene-styrene triblock copolymers, for example those available from Dexco Polymers, Houston, Tex., under the trade name VECTOR 8508M, from Enichem Elastomers America, Houston, Tex., under the trade name "SOL-T-6302," and those from Dynasol Elastomers, under the trade name CALPRENE 401; styrene-butadiene diblock copolymers; and mixed triblock and diblock copolymers containing styrene and butadiene, for example those available from Kraton Polymers, Houston, Tex., under the trade name KRATON D1118. KRATON D1118 is a mixed diblock/triblock styrene and butadiene containing copolymer, containing 35% by weight styrene.

The optional polybutadiene- or polyisoprene-containing elastomer can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. An exemplary second block copolymer of this type is KRATON GX1855 (commercially available from Kraton Polymers), which is believed to be a mixture of a styrene-high 1,2-butadiene-styrene block copolymer and a styrene-(ethylene-propylene)-styrene block copolymer.

Typically, the unsaturated polybutadiene- or polyisoprene-containing elastomer component is present in the resin system in an amount of about 2 to about 60 wt. % with respect to the total resin system, more specifically about 5 to about 40 wt. %, or even more specifically about 10 to about 20 wt. %.

Crosslinking agents can optionally be added to increase the crosslink density of the resin composition. Examples of cross-linking agents include, without limitation, triallylisocyanurate, triallylcyanurate, diallyl phthalate, divinyl benzene, and multifunctional acrylate monomers (e.g., the SARTOMER resins available from Sartomer USA, Newtown Square, Pa.) and combinations thereof, all of which are commercially available, with triallylisocyanurate being particularly exemplary. The cross-linking agent content of the thermosetting composition can be readily determined by one of ordinary skill in the art, depending upon the desired flame retardancy of the composition, the amount of the other constituent components, and the other properties desired in the final product. More particularly, the amount of cross-linking agent depends upon the amounts of the other components in the thermosetting composition, and attaining excellent flame retardancy, electrical and moisture properties, all of which will be described in greater detail below. When used to increase the crosslink density, effective quantities are greater than or equal to about 0.5 wt. %, specifically greater than or equal to about 1 wt. %, and more specifically greater than or equal to about 5 wt. % based on the total weight of the thermosetting composition. Effective quantities can be less than about 10 wt. %, specifically less than about 7 wt. %.

Importantly, the composition of the present thermosetting composition for the dielectric substrate layer comprises a flame retardant effective amount of a dihydro-oxa-phosphophenanthrene (DOPO) derivative. Such compounds, in sufficient amount in terms of weight percent and in proper combination with inorganic filler in terms of volume percent, can attain a desirable V-0 rating according to UL-94 (Underwriter's Laboratories Subject 94) and other excellent ratings in related test methods, including glass-fiber reinforced formulations where conventional fire retardant systems tend to fail. Specifically, in one embodiment a glass-fiber reinforced dielectric layer is combined with an optionally reinforced bond ply.

Such DOPO derivatives can have a high degree of volatility. In one embodiment, the compounds start decomposition or volatilization at 310° C. and achieve at least 70% by weight decomposition or volatization by 450° C. The peak melting point of the compound is higher than DOPO (the mono-compound) and specifically at least about 260° C., more specifically 260 to 320° C., most specifically 275 to 305° C.

In a DOPO derivative, which is used in both the dielectric substrate and the bond ply layer described herein, the oxaphosphorinoxide group comprises a phosphorous atom and one oxygen atom as part of an organocyclic structure, particularly a five or six membered ring. According to one embodiment, an oxaphosphorinoxide-containing moiety can be represented by the following structural formula:

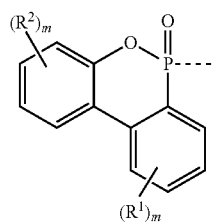

(1)

wherein each $R^1$ and $R^2$ can independently represent hydrogen or a $C_1$-$C_6$ hydrocarbyl group, specifically a $C_1$-$C_4$ alkyl group, and each m can independently represent an integer from 1 to 4. In structure (1), the dotted line represents a monovalent bond. When the bond is attached to a hydrogen atom, the resulting compound can be named as 6H-dibenz[c,e][1,2]oxaphosphorin-6-oxide, 3,4:5,6-dibenzo-2H-1,2-oxaphosphorin-2-oxide or 9,10-dihydro-9-oxa-10-phosphorylphenanthrene-10-oxide, abbreviated as DOPO(CAS RN 35948-25-5). Such compound is commercially available from Sanko Co, Ltd.

The DOPO-containing compounds can be characterized by the presence of two or three oxaphosphorinoxide-containing moieties. These moieties can be connected with a bivalent or trivalent bridging group Q. Such compounds can be represented by the following structure:

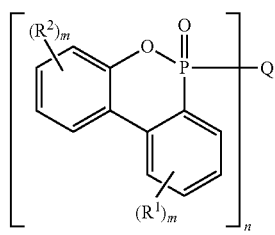

(2)

wherein $R^1$, $R^2$, and m are defined above and Q can represent a $C_{1-24}$ hydrocarbyl, n is on average 2 to 4. When n is 2, the compound can be referred to as a DOPO dimer or di-DOPO compound.

According to one embodiment, suitable DOPO derivatives are characterized by the presence of three moieties of structure (1). These moieties can be connected with a trivalent group Q, such as compounds of the structure:

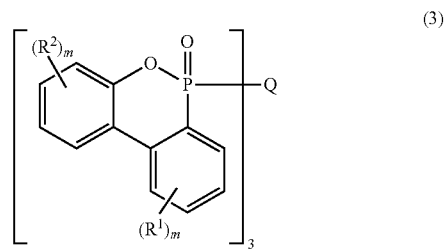

(3)

wherein the phenyl groups may be substituted by substituents as defined above. Adducts of melamine or guanidine can be employed. Representative examples of these compounds are compounds obtainable by condensation of melamine with DOPO and formaldehyde. The reaction product of DOPO with a maleic anhydride polymer or other functionalized polymer or oligomer can also be used, in which case the polymer or oligomer has on average about between 2.5 and 3.5 DOPO moieties per polymer chain.

In one embodiment, the DOPO derivative has the following structure:

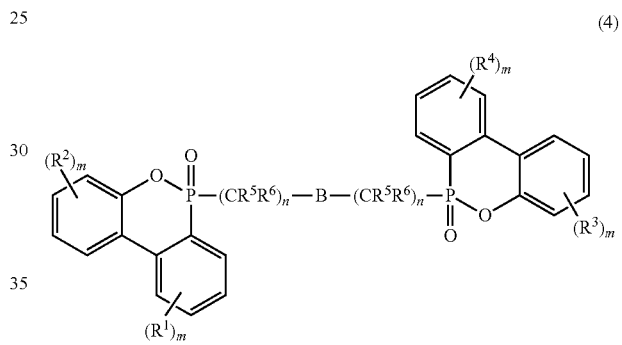

(4)

wherein B is a direct bond, $C_6$-$C_{12}$ aryl, $C_3$-$C_{12}$ cycloalkyl, or a $C_3$-$C_{12}$ cycloalkenyl, wherein said cycloalkyl or cycloalkenyl may be optionally substituted by a $C_1$-$C_6$ alkyl; each $R^1$, $R^2$, $R^3$ and $R^4$ are independently hydrogen, $C_1$-$C_{15}$ alkyl, $C_6$-$C_{12}$ aryl, $C_7$-$C_{15}$ aralkyl or $C_7$-$C_{15}$ alkaryl; or $R^1$ and $R^2$ or $R^3$ and $R^4$ taken together can form a saturated or unsaturated cyclic ring, wherein said saturated or unsaturated cyclic ring may be optionally substituted by a $C_1$-$C_6$ alkyl; each m is independently 1, 2, 3 or 4; each $R^5$ and $R^6$ are independently hydrogen or a $C_1$-$C_6$ alkyl; and each n is independently 0, 1, 2, 3, 4 or 5; with the proviso that when B is aryl or a direct bond, n cannot be 0.

In one embodiment, both n subscripts are 1 or 2 and B is a direct bond. In another embodiment, both n subscripts are 1, and B is a $C_6$-$C_{12}$ aryl. In still another embodiment, $R^1$, $R^2$, $R^3$ and $R^4$ are independently hydrogen or a $C_1$-$C_6$ alkyl. In another embodiment, $R^5$ and $R^6$ are each independently hydrogen or methyl.

Specific compounds of Structure (4) that can be used in this invention are 6H-Dibenz[c,e][1,2]oxaphosphorin, 6,6'-(1,4-ethanediyl)bis-,6,6'-dioxide; 6H-Dibenz[c,e][1,2]oxaphosphorin, 6,6'-(1,4-butanediyl)bis-,6,6'-dioxide; or 6H-Dibenz[c,e][1,2]oxaphosphorin, 6,6'-(p-xylenediyl)bis-,6,6'-dioxide.

The DOPO-containing compounds defined above are known compounds, are commercially available, and/or can be prepared by known methods. In one embodiment, the DOPO derivative comprises a compound that can be represented by Structure (5):

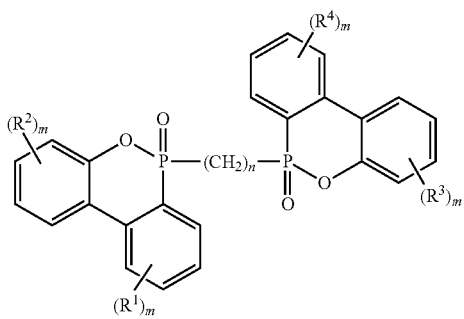

(5)

In Structure (5), each $R^1$, $R^2$, $R^3$ and $R^4$ are independently hydrogen, $C_1$-$C_{15}$ alkyl, $C_6$-$C_{12}$ aryl, $C_7$-$C_{15}$ aralkyl or $C_7$-$C_{15}$ alkaryl; or $R^1$ and $R^2$ or $R^3$ and $R^4$ taken together can form a saturated or unsaturated cyclic ring, wherein said saturated or unsaturated cyclic ring may be optionally substituted by a $C_1$-$C_6$ alkyl; each m is independently 1, 2, 3 or 4; and n is 2 to about 12, specifically 2 to 6, more specifically 2 to 3.

A specific embodiment of the compound of Structure (5) can be represented by Structure (6):

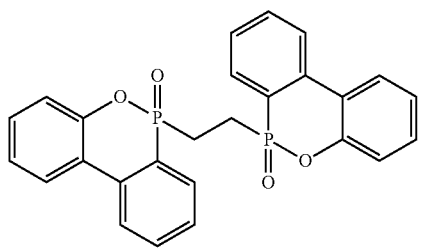

(6)

This compound is (6H-Dibenz[c,e][1,2]oxaphosphorin, 6,6'-(1,2-ethanediyl)bis-,6,6'-dioxide)

The peak melting point of the DOPO derivative in the present composition can be greater than about 240° C., specifically about 240 to 310° C., more specifically 274 to 305° C. For determining peak melting point, a differential scanning calorimeter (DSC) may be used such as a TA Instruments Q2000 analyzer with standard calibration according to the instrument manufacturers recommended procedures. The peak melting point is the maximum endotherm for a particular melting transition.

In one embodiment, the DOPO derivative is a high melting point optical isomer (R,S diastereomer) having the following Structure (7):

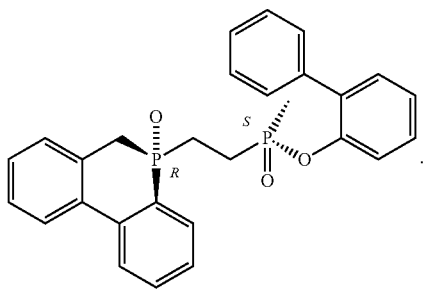

(7)

Typically synthesis involves a mixture of stereoisomers being produced. When preparing a compound of Structure (7), at least three stereoisomers can be produced in the reaction product. In addition to the high melting point diastereomer of Structure (7) two others are lower melting point enantiomers of Structures (8) and (9):

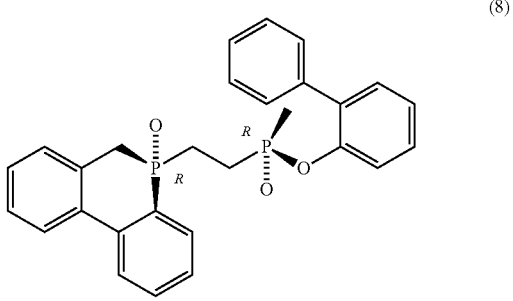

(8)

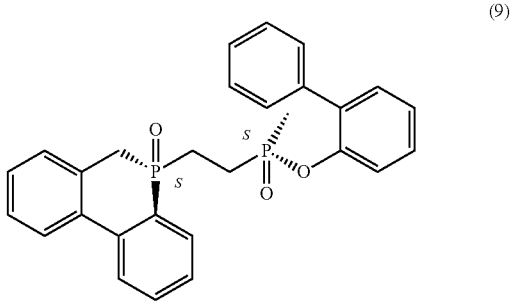

(9)

According to one embodiment, it is advantageous to employ a relatively higher amount of the high melting point constituent, i.e., a DOPO-derived composition with a higher ratio of higher melting point compound (7) vs. low melting point compounds, inclusive of compounds (8) and (9).

An "Optical Isomer Ratio" can be calculated from DSC curves, in which the OI Ratio is equal to $D_h/(D_h+D_l)$, wherein $D_h$ is the area of high melting point peak and $D_l$ is the area of low melting point peak. Another method of calculating the Diastereomer Ratio is from $^{31}$P NMR which can be calculated by using an NMR ratio=$(D_h-D_l \times 0.5)/(D_h+D_l)$, wherein $D_h$ is the area of high field peak and $D_l$ is the area of low field peak. The NMR ratio obtained from $^{31}$P NMR is close to values obtained from DSC curves and, therefore, can confirm the diastereomer optical isomer ratio obtained by DSC scan.

In other embodiments, the composition has an Optical Isomer Ratio of greater than about 0.6, more specifically greater than about 0.7, or most specifically greater than about 0.9. An Optical Isomer Ratio of greater than about 0.95, based on using DSC or $^{31}$NMR can also be used.

The DOPO derivative compounds according to Structures (6) to (9), for use in thermosetting compositions, can be produced by a reaction that is essentially a dehydration reaction of DOPO tautomer phosphonites with diols, followed by an Arbuzov rearrangement producing the DOPO dimer derived compound (DiDOPO compound having two DOPO-groups) and water. Such methods are disclosed in PCT/US2001/030183 and PCT/US2010/035354, hereby incorporated by reference in their entirety.

Higher concentrations of the higher melting point isomer of Structure (7) can be obtained by various methods, as will be understood by the skilled artisan. For example, a composition containing undesired amounts of isomers of Structure (8) and (9) can be contacted with alcohols, water, or mixtures thereof in the presence of an acid catalyst, thereby producing a composition containing larger amounts of higher melting point isomers of Structure (7).

In particular, low melting point isomers can be converted to high melting point isomers in the presence of alcohols and/or water at a temperature ranging from 0 to 300° C. in which isomerization is catalyzed by acid catalysts that include mineral acids and Lewis acids. Mineral acids include sulfuric acid, methanesulfonic acid, hydrochloric acid, phosphoric acid, phosphonic acids and phosphinic acids. Lewis acids are defined as a molecular entity that is an electron pair acceptor and include aluminum chloride, zinc chloride, ferric chloride, and the like.

For example, in one embodiment of a conversion process, a mixture of an alkylene glycol such as ethylene glycol and water can be fed to a solution of a DOPO compound having a reactive oxaphosphorinoxide group at a temperature of 25 to 300° C. under elevated pressure or normal pressure. Usually the length of time varies from a few minutes to 10 hours. The amount of catalyst can be from 0.1% to 50% of Di-DOPO.

In general, the oxaphosphorinoxide-containing aromatic compound can be added to the thermosetting composition for a dielectric substrate in an amount of about 10 to 35 wt. %, specifically 15 to 30 wt. %, more specifically at least 20 wt. %, based on the total composition. Based on total resin, i.e. resin system (including all polymers and oligomers or reactive diluents that become part of the resin system, but not including inorganic filler or non-reactive additives), the amount of oxaphosphorinoxide-containing aromatic compound is greater than 95 pphr (parts per hundred resin), specifically greater than 96 pphr to 120 pphr, more specifically 97 to 110 pphr. The amount of the oxaphosphorinoxide-containing aromatic compound in the dielectric substrate composition can be selected so that the composition will have a phosphorous content of about 1 wt. % to about 10 wt. %, specifically 2 to 5 wt. %, based on the total composition.

The oxaphosphorinoxide-containing aromatic compound can be ground or milled prior to combining with the resin system. The $d_{50}$ particle size after grinding or milling can be less than about 15 micrometers, specifically less than about 3 micrometers.

The composition for the dielectric substrate also comprises one or more curing agents for the resin system to accelerate the curing reaction of the polyenes having olefinic reactive sites. The curing agents comprise free-radical initiators. Radical initiators are substances that can produce radical species under mild conditions and provide free radical polymerization. These substances generally provide weak bonds, i.e., bonds that have small dissociation energy. Conventional free-radical initiators can include peroxide initiators, azo initiators, carbon-carbon initiators, persulfates, hydrazines, hydrazides, benzophenones, halogens, or blends thereof that decompose into free radicals during a curing process.

Commercially available C—C initiators include, for example, 2,3-dimethyl-2,3-diphenylbutane (CAS No. 1889-67-4, from Akzo Nobel under the trade name of PERKADOX 30, from Degussa under the brand name of CCDFB-90, and from Nippon Oil & Fat Corporation under the trade name of NOFINER; 3,4-dimethyl-3,4-diphenylhexane (CAS No. 10192-93-5) from Degussa under the brand name of CCDFH); poly(1,4-diisopropylbenzene) (CAS No. 100-18-5) from Degussa under the brand name of CCPIB; and combinations thereof. Commercial examples of suitable peroxide initiators include, but are not limited to, Varox® 231XL and DCP-R from AtoFina, Perkadox® BC and 14 from Akzo Nobel, and Elastochem® DCP-70 from Rhein Chemie. Other peroxides and mixtures of peroxides having different activation temperatures may be employed. Varox® VC-R is α'-di-(t-butyl peroxy)diisopropylbenzene compound having a molecular weight of 338 Da and a melting point of 50° C.

Typical total amounts of the free-radical initiators are from about 0.5 to 10, specifically 1 to about 6, more specifically 2 to 5 wt. % of the total resin, in both the dielectric substrate and protective adhesive layer. The actual amount of the free-radical initiator added, however, can vary depending on the specific initiator compound used and the specific formulation of the thermosetting composition to be used.

The thermosetting composition for both the dielectric substrate material (and the bond ply layer) in a circuit subassembly further comprises particulate fillers. Examples of suitable fillers include titanium dioxide (rutile and anatase), barium titanate, strontium titanate, silica (particles and hollow spheres) including fused amorphous silica; corundum, cordierite, wollastonite, aramide fibers (e.g., Kevlar®), fiberglass, $Ba_2Ti_9O_{20}$, glass spheres, quartz, boron nitride, aluminum nitride, silicon carbide, beryllia, alumina, magnesia, mica, talcs, nanoclays, aluminosilicates (natural and synthetic), magnesium oxide, and magnesium hydroxide. Combinations of fillers can also be used. More specifically, rutile titanium dioxide and amorphous silica are especially desirable because these fillers have a high and low dielectric constant, respectively, thereby permitting a broad range of dielectric constants combined with a low dissipation factor to be achieved in the final cured product by adjusting the respective amounts of the two fillers in the composition. Most specifically, fused spherical silica particles can be used, in combination with a minor amount of titanium oxide.

The thermosetting composition for a dielectric substrate material can optionally further include woven, thermally stable webs of a suitable fiber, specifically glass (E, S, D, and NE glass), including flat glass or close-weaved fiber glass, or high temperature organic fibers. Such thermally stable fiber reinforcement provides a circuit laminate with a means of controlling shrinkage upon cure within the plane of the laminate. In addition, the use of the woven web reinforcement, specifically glass fibers, renders a circuit substrate with a relatively high mechanical strength.

The thermosetting composition for the dielectric substrate can comprises about 30 to about 70 percent by weight, specifically greater than 40 to 60 weight percent, more specifically 44 to 55 weight percent, based on the total weight of the thermosetting composition, of inorganic filler. The volume percent of inorganic filler in the dielectric substrate can be, for example 15 to 55 volume percent specifically 20 to 50 volume percent, more specifically 25 to 45 volume percent, most specifically 30 to 40 volume percent.

The thermosetting composition for a bond ply layer can comprise about 10 to about 50 percent by weight, specifically 15 to 45 weight percent, more specifically 20 to 40 weight percent, based on the total weight of the thermosetting composition, of inorganic filler. The volume percent of inorganic filler in the bond ply layer can be, for example 5 to 35 volume percent specifically 10 to 30 volume percent, more specifically 17 to 27 volume percent, most specifically 20 to 25 volume percent. In one embodiment, the volume percent of the filler in the bond ply layer can be at least 5 volume percent, specifically at least 10 volume percent, more specifically at least 12 volume percent less than the volume percent of inorganic filler in the dielectric substrate.

For flame retardance, the total volume percent of the DOPO compound and the inorganic filler in the dielectric substrate is important. In particular, the total volume percent of the DOPO compound and inorganic filler in the dielectric substrate must be at least 57 volume percent, specifically at least 58 to 65 volume percent, more specifically 59 to 62 volume percent. The total volume percent of the DOPO compound and the inorganic filler in the bond ply layer can be less than in the dielectric substrate layer, specifically 40 to 60 volume percent specifically at least 45 to 55 volume percent. In one embodiment, the total volume percent of filler and DOPO compound in the bond ply layer can be at least 5 to 20 volume percent less than in the dielectric substrate.

In an optional embodiment, the filler in the dielectric layer and/or bond ply can be coated, i.e., surface treated. Examples of coated filler can include silane coated, alumina coated, and combinations thereof, specifically silica-methyl hydrogen polysiloxane coated filler. Examples of the surface-treating agent that can be used to form silica, alumina and/or silane coatings can include, without limitation, methyl hydrogen polysiloxane such as APS-219 from Advanced Polymers Inc., MH1107 Fluid from Dow Corning, silane coupling agents such as vinyltrichlorosilane, vinyltrimethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, N-β(aminoethyl)γ-aminopropylmethyldimethoxysilane, N-β(aminoethyl)γ-aminopropyltrimethoxysilane, N-β(aminoethyl)γ-aminopropyltriethoxysilane, γ-aminopropyltrimethoxysilane, γ-aminopropyltriethoxysilane, N-phenyl-γ-aminopropyltrimethoxysilane and γ-mercaptopropyltrimethoxysilane.

The circuit subassembly further comprises a protective adhesive layer, in between and in direct contact with a dielectric substrate layer and conductive layer, which provides chemical resistance properties of the thermosetting composition in a circuit laminate, particularly in the case of base exposure during circuit manufacturing processes. This improvement can be measured by "base weight loss." This improvement can allow improved resistance to degradation during processing involving a strong base.

In the case of circuit subassemblies comprising high profile copper or low profile copper, the protective adhesive layer can protect the dielectric substrate layer from exposure to high pH basic solution that can attack the oxaphosphorinoxide-containing aromatic compound contained in the dielectric substrate layer. (As defined herein, a low profile copper is defined as having an RMS roughness that is less than 1.5 micrometers, and a high profile copper is defined as having an RMS roughness greater than 1.5 micrometers, specifically 2 to 3 micrometers.) Without wishing to be bound by theory, it is believed that basic, or high pH, solution can dissolve or react with the oxaphosphorinoxide-containing aromatic compound and remove or leach it from the dielectric substrate during processing of the circuit material. The oxaphosphorinoxide-containing aromatic compound, specifically the DiDOPO compound of structure (7), when incorporated into non-polar resin thermosetting compositions, has been found to be soluble in, and reactive with, alkaline solution. Such alkaline solutions are often used during some of the processes used to manufacture printed circuit boards. It has been found that the flame retardant properties of the oxaphosphorinoxide-containing aromatic compound do not deteriorate during such processes when protected by a thin layer of adhesive protective material, thereby greatly improving resistance to basic solutions. At the same time, the protective adhesive layer should not cause a significantly adverse effect on the desired electrical properties of the resultant circuit laminate, such as low dielectric constant, low dissipation factor, low water absorption, and improved dielectric breakdown strength.

The composition of a protective adhesive layer and a bond ply in a circuit subassembly can independently comprise a poly(arylene ether), which can be in the form of a homopolymer or a copolymer, including a graft or a block copolymer. Combinations of various forms can be used. Poly(arylene ether)s comprise a plurality of structural units of structure:

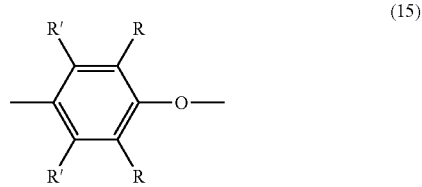

(15)

wherein for each structural unit, each R and R' is independently hydrogen, primary or secondary $C_{1-7}$ alkyl, phenyl, $C_{1-7}$ aminoalkyl, $C_{1-7}$ alkenylalkyl, $C_{1-7}$ alkynylalkyl, $C_{1-7}$ alkoxy, $C_{6-10}$ aryl, and $C_{6-10}$ aryloxy. In some embodiments, each R is independently $C_{1-7}$ alkyl or phenyl, for example, $C_{14}$ alkyl, and each R' is independently hydrogen or methyl.

Exemplary poly(arylene ether)s include poly(2,6-dimethyl-1,4-phenylene ether), poly(2,6-diethyl-1,4-phenylene ether), poly(2,6-dipropyl-1,4-phenylene ether), poly(2-methyl-6-allyl-1,4-phenylene ether), poly(di-tert-butyl-dimethoxy-1,4-phenylene ether), poly(2,6-dichloromethyl-1,4-phenylene ether, poly(2,6-dibromomethyl-1,4-phenylene ether), poly(2,6-di(2-chloroethyl)-1,4-phenylene ether), poly(2,6-ditolyl-1,4-phenylene ether), poly(2,6-dichloro-1,4-phenylene ether), poly(2,6-diphenyl-1,4-phenylene ether), and poly(2,5-dimethyl-1,4-phenylene ether). A useful poly(arylene ether) comprises 2,6-dimethyl-1,4-phenylene ether units, optionally in combination with 2,3,6-trimethyl-1,4-phenylene ether units.

The poly(arylene ether), specifically a poly(phenylene ether), can be functionalized so as to provide a functional group that enhances adhesion between a conductive metal layer and a circuit substrate layer. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. In one embodiment the functional group is a carboxylic acid or ester group. Examples of polyfunctional compounds that can provide a carboxylic acid functional group include maleic acid, maleic anhydride, fumaric acid, and citric acid. The polybutadiene or polyisoprene polymer(s) used in the adhesive composition can be co-curable with a poly(arylene ether).

In particular, suitable functionalized poly(arylene ether)s include the reaction product of a poly(arylene ether) and a cyclic carboxylic acid anhydride. Examples of suitable cyclic anhydrides are maleic anhydride, succinic anhydride, glutaric anhydride, adipic anhydride, and phthalic anhydride, more specifically, maleic anhydride. Modified poly(arylene ethers) such as maleinated poly(arylene ethers) can be produced by methods as described in U.S. Pat. No. 5,310,820, or are commercially available. Examples of commercially available suitable modified and unmodified poly(arylene ethers) include PPE-MA from Asahi (a maleinized poly(arylene ether)), and Blendex® HPP820 from Chemtura (an unmodified poly(arylene ether), and SA9000 from Sabic Innovative Plastics.

The poly(arylene ether) can have a relatively high number average molecular weight, greater than 5000 Daltons, specifically greater than 10,000 Daltons, as determined by gel permeation chromatography (GPC), typically as specified by the manufacturer. Thus, it is used as a solid, rather than a liquid.

The composition of the bond ply and the protective adhesive layer can independently further comprise, specifically can be based on, a polybutadiene or polyisoprene polymer, specifically including a vinyl terminate polybutadiene or polyisoprene polymer. As indicated above, with respect to the dielectric substrate layer, a "polybutadiene or polyisoprene polymer" as used herein includes homopolymers derived from butadiene, homopolymers derived from isoprene, and copolymers derived from butadiene and/or isoprene and/or less than 50 wt. % of a monomer co-curable with the butadiene and/or isoprene. In other words, a copolymer of butadiene and/or isoprene can comprise polymers with greater than 50 wt. % butadiene, greater than 50% isoprene, or greater than 50% of butadiene plus isoprene. Suitable monomers co-curable with butadiene and/or isoprene include monoethylenically unsaturated compounds such as acrylonitrile, ethacrylonitrile, methacrylonitrile, alpha-chloroacrylonitrile, beta-chloroacrylonitrile, alpha-bromoacrylonitrile, $C_{1-6}$ alkyl (meth)acrylates (for example, methyl (meth)acrylate, ethyl (meth)acrylate, n-butyl (meth)acrylate, n-propyl (meth)acrylate, and isopropyl (meth)acrylate), acrylamide, methacrylamide, maleimide, N-methyl maleimide, N-ethyl maleimide, itaconic acid, (meth)acrylic acid, styrene, alkenyl aromatic compounds as described below, and a combination comprising at least one of the foregoing monoethylenically unsaturated monomers.

In an advantageous embodiment, the polybutadiene polymer comprises a syndiotactic polybutadiene homopolymer with no co-curable monomer. The syndiotactic polybutadiene homopolymer is often used in combination with a different polybutadiene polymer, a polyisoprene polymer, or a combination thereof.

In still other embodiments, the bond ply and/or the protective adhesive layer can independently comprise an elastomeric polymer, for example, in combination with a poly(arylene ether) and/or polybutadiene. The elastomeric polymer can be co-curable with the poly(arylene ether) and/or the polybutadiene or isoprene resin. A variety of elastomeric polymers can be used, including, for example, block copolymers of butadiene and/or isoprene with a styrenic monomer, vinyl pyridine, acrylonitrile, (meth) acrylic acid and their esters; ethylene-propylene-diene; ethylene-propylene; styrene-(ethylene-butylene)-containing diblock or triblock; silicone or fluorinated elastomers; and the like. The elastomeric polymer can have a glass transition temperature at or below room temperature.

Elastomers include elastomeric block copolymers comprising a block (A) derived from an alkenyl aromatic compound and a block (B) derived from a conjugated diene. The arrangement of blocks (A) and (B) includes linear and graft structures, including radial teleblock structures having branched chains. Examples of linear structures include diblock (A-B), triblock (A-B-A or B-A-B), tetrablock (A-B-A-B), and pentablock (A-B-A-B-A or B-A-B-A-B) structures as well as linear structures containing 6 or more blocks in total of A and B. Specific block copolymers include diblock, triblock, and tetrablock structures, and specifically the A-B diblock and A-B-A triblock structures.

The alkenyl aromatic compound providing the block (A) is represented by structure:

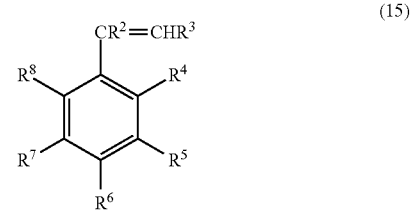

(15)

wherein each of $R^2$ and $R^3$ is independently hydrogen, $C_1$-$C_5$ alkyl, bromo, or chloro, and each of $R^4$, $R^5$, $R^6$, $R^7$, and $R^8$ is independently hydrogen, $C_1$-$C_{12}$ alkyl, $C_3$-$C_{12}$ cycloalkyl, $C_6$-$C_{12}$ aryl, $C_7$-$C_{12}$ aralkyl, $C_7$-$C_{12}$ alkaryl, $C_1$-$C_{12}$ alkoxy, $C_3$-$C_{12}$ cycloalkoxy, $C_6$-$C_{12}$ aryloxy, chloro, bromo, or hydroxy. Exemplary alkenyl aromatic compounds include styrene, 3-methylstyrene, 4-methylstyrene, 3,5-diethylstyrene, 4-n-propylstyrene, alpha-methylstyrene, alpha-methyl vinyltoluene, alpha-chlorostyrene, alpha-bromostyrene, dichlorostyrene, dibromostyrene, tetra-chlorostyrene, and the like, and combinations comprising at least one of the foregoing compounds. Styrene and/or alpha-methylstyrene are often used.

Specific examples of the conjugated dienes used to provide block (B) include 1,3-butadiene, 2-methyl-1,3-butadiene (isoprene), 2,3-dimethyl-1,3-butadiene, and 1,3-pentadiene, specifically 1,3-butadiene and isoprene. A combination of conjugated dienes can be used. The block (B) derived from a conjugated diene is optionally partially or fully hydrogenated.

Exemplary block copolymers comprising a block (A) derived from an alkenyl aromatic compound and block (B) derived from a conjugated diene include styrene-butadiene diblock copolymer (SB), styrene-butadiene-styrene triblock copolymer (SBS), styrene-isoprene diblock copolymer (SI), styrene-isoprene-styrene triblock copolymer (SIS), styrene-(ethylene-butylene)-styrene triblock copolymer (SEBS), styrene-(ethylene-propylene)-styrene triblock copolymer (SEPS), and styrene-(ethylene-butylene) diblock copolymer (SEB). Such polymers are commercially available, for example from Shell Chemical Corporation under the trade names KRATON D-1101, KRATON D-1102, KRATON D-1107, KRATON D-1111, KRATON D-1116, KRATON D-1117, KRATON D-1118, KRATON D-1119, KRATON D-1122, KRATON D-1135X, KRATON D-1184, KRATON D-1144X, KRATON D-1300X, KRATON D-4141, KRATON D-4158, KRATON G1726, and KRATON G-1652. KRATON D-1118 is a solid SB-SBS copolymer. This copolymer has polystyrene end blocks and a rubbery polybutadiene mid-block with about 20% SBS triblock and about 80% SB diblock. It is a low modulus, low cohesive strength, soft rubber.

Exemplary compositions for a protective adhesive layer are disclosed in U.S. Pat. No. 8,431,222 to Paul, hereby incorporated by reference in its entirety. The relative amount of components in the protective adhesive layer or the bond ply layer can depend on the particular substrate material used, the desired properties of the circuit materials and circuit laminates, and like considerations. It has been found that use of a poly(arylene ether) contributes increased bond strength between a conductive metal layer, particularly copper, and a relatively nonpolar dielectric substrate material, but also can make the dielectric substrate layer or partially cured prepreg less tacky so there is little or no blocking and repositioning during cladding is easier. The use of a polybutadiene or polyisoprene polymer provides increases high temperature resistance of the laminates, particularly when these polymers are carboxy-functionalized. The use of an elastomeric block copolymer can function to compatibilize the components of the adhesive.

In one embodiment, the bond ply composition comprises about 10 to about 70 wt. %, specifically about 15 to about 69 wt. %, more specifically about 20 to about 50 wt. % of the poly(arylene ether), specifically poly(phenylene ether), and about 20 to about 75 wt. %, specifically about 30 to about 60 wt. %, more specifically about 50 to about 70 wt. % of the polybutadiene or polyisoprene polymer(s), each of the foregoing amounts being based on the total weight of the polymer/resin portion of the adhesive composition.

In one embodiment, the liquid resin volume percent in composition of the bond ply is greater than 27 percent, in order to obtain good fill and flow during lamination. Specifically, the liquid resin volume percent (that can comprise, for example, reactive monomer, polybutadiene resin, and triallyl cyanurate) can be 27.5 to 32 volume percent, more specifically 28 to 31 volume percent. Spherical silica can also contribute to good fill and flow properties.

In addition to the one or more of the polymers described above, the composition for bond ply layer and dielectric layer can further optionally independently comprise additives such as curing agents, crosslinking agents, viscosity modifiers, coupling agents, wetting agents, fillers, and antioxidants. The particular choice of additives depends upon the nature of the conductive layer and the circuit substrate composition and are selected so as to enhance or not substantially adversely affect adhesion between a conductive layer and a circuit substrate, dielectric constant, dissipation factor, water absorbance, and/or other desired properties of the circuit material. The composition of the bond ply layer further comprises inorganic filler which can be selected from the same inorganic fillers listed for the dielectric substrate, as described earlier. As mentioned above, the volume percent of the inorganic filler in the bond ply layer can be sufficient to provide flame retardance in combination with the phosphorous-containing flame retardant, but less than in the dielectric substrate layer in order to provide greater protection from the processing solutions which can deplete the amount of flame retardant. In contrast, the protective adhesive can contain less that 15 volume percent, specifically less than 10 volume percent, more specifically less than 5 volume percent or essentially no inorganic filler.

Curing agents for use in the dielectric substrate layer and the thermosetting composition of other layers can include those useful in initiating cure of the relevant polymers. Examples include, but are not limited to, azides, peroxides, sulfur, and sulfur derivatives. Free radical initiators are especially desirable as cure initiators. Examples of free radical initiators include peroxides, hydroperoxides, and non-peroxide initiators such as 2,3-dimethyl-2,3-diphenyl butane. Examples of peroxide curing agents include dicumyl peroxide, alpha, alpha-di(t-butylperoxy)-m,p-diisopropylbenzene, 2,5-dimethyl-2,5-di(t-butylperoxy)hexane-3, and 2,5-dimethyl-2,5-di(t-butylperoxy)hexyne-3, and mixtures comprising one or more of the foregoing cure initiators. The cure initiator, when used, is typically present in an amount of about 0.25 wt. % to about 15 wt. %, based on the total weight of the adhesive composition.

Crosslinking agents for use in the bond ply layer can advantageously comprise reactive monomers as discussed above with respect to the dielectric substrate layer, which reactive monomers can increase the cross-link density upon cure of the composition of the bond ply. Useful amounts of crosslinking agents are about 0.1 to about 50 wt. %, based on the total weight of the adhesive composition.

In particular, it has been found advantageous to use a crosslinking agent in the bond ply layer that is a reactive nitrogen-containing compound. The oxaphosphorinoxide-containing aromatic compound and nitrogen-containing compound can act synergistically with regard to flame retardance. Examples of such nitrogen-containing compounds can include, without limitation, triazines, guanidines, cyanurates, isocyanurates, ammonium polyphosphates, phosphazene, silazane and its polymer, melamine based resins, and the like, and mixtures thereof. Specifically, a reactive cyanurate or isocyanurate compound can include triallyl cyanurate. The nitrogen-containing compounds are known in the art, as are methods for their preparation, and are commercially available.

When present in the composition of the bond ply layer, the nitrogen-containing compound can be used in an amount of about 1 to about 10 percent by weight, specifically 2 to 8 weight percent, more specifically 3 to 6 weight percent, based on the total weight of the thermosetting composition. The thermosetting composition of the dielectric layer need not have high levels of a nitrogen-containing compound or salt, which can be detrimental to desired properties. Specifically, the composition of the dielectric layer can have less than 10 weight percent nitrogen, specifically less than 1 weight percent nitrogen.

In one embodiment, the weight ratio of the oxaphosphorinoxide-containing aromatic compound to the nitrogen-containing compound in the bond ply layer can be greater than 3:1, specifically greater than 5:1.

Suitable antioxidants for use in any one or more of the layers in the circuit subassembly can include radical scavengers and metal deactivators. A non-limiting example of a free radical scavenger is poly[[6-(1,1,3,3-tetramethylbutyl) amino-s-triazine-2,4-dyil][(2,2,6,6,-tetramethyl-4-piperidyl)imino]hexamethylene[(2,2,6,6-tetramethyl-4-piperidyl)imino]], commercially available from Ciba Chemicals under the trade name Chimmasorb® 944. A non-limiting example of a metal deactivator is 2,2-oxalyldiamido bis [ethyl 3-(3,5-di-t-butyl-4-hydroxyphenyl)propionate] commercially available from Uniroyal Chemical (Middlebury, Conn.) under the trade name Naugard® XL-1. A single antioxidant or a mixture of two or more antioxidants can be used. Antioxidants are typically present in amounts of up to about 3 wt. %, specifically about 0.25 to about 2.0 wt. %, based on the total weight of the adhesive composition.

Useful conductive layers for the formation of the circuit laminates, multilayer circuit laminates can include, without limitation, stainless steel, copper, gold, silver, aluminum, zinc, tin, lead, transition metals, and alloys comprising at least one of the foregoing, with copper being exemplary. There are no particular limitations regarding the thickness of the conductive layer, nor are there any limitations as to the shape, size or texture of the surface of the conductive layer. Specifically, however, the conductive layer comprises a thickness of about 3 micrometers to about 200 micrometers, specifically about 9 micrometers to about 180 micrometers. When two or more conductive layers are present, the thickness of the two layers can be the same or different.

As mentioned above, a circuit subassembly having the above-described dielectric substrate layer and protective adhesive layer can be used with a conductive layer to make circuit materials, circuit laminates, circuits, and multilayer circuits.

In an exemplary embodiment, the conductive layer is a copper layer. Suitable conductive layers include a thin layer of a conductive metal such as a copper foil presently used in the formation of circuits, for example, electrodeposited copper foils.

Additional roughness can be created in a secondary plating step. The roughness of a copper foil is generally characterized by contact profilometry or optical interferometry. Most foil manufacturers measure roughness with a contact profilometer, due to their long history with such a measurement system, for example, using a Veeco Instruments WYCO Optical Profiler in the method of white light interferometry. Two frequently reported ways to quantities numerically characterize the surface roughness are the RMS roughness value, $R_q$, and the peak-to-valley roughness, $R_z$, with both reported in dimensions of length. For example, conventional ED copper foil made for the circuit industry has had treated side $R_z$ values of 7 to 20 micrometers (μm) (corresponding to $R_q$ values of about 1.2 to 4 μm) when measured by the WYCO Optical Profiler. In one embodiment of a circuit subassembly, a conductive metal layer having an RMS surface roughness that is greater than about 1 micrometer, specifically greater than about 2 micrometer is present.

Turning now to a method of forming a circuit subassembly, a protective adhesive layer can be directly applied to a conductive layer or a dielectric substrate layer as a coating (if of sufficiently low viscosity), or dissolved or suspended, i.e., in the form of a solution. Where a solution is used, the composition for the protective adhesive layer is dissolved in a suitable solvent before application. The solvent is chosen so as to dissolve the composition and to have a convenient evaporation rate for applying and drying the coating. A non-exclusive list of possible solvents is xylene, toluene, methyl ethyl ketone, methyl isobutyl ketone, hexane, and higher liquid linear alkanes, such as heptane, octane, nonane, and the like, cyclohexane, isophorone, and various terpene-based solvents. Specifically, suitable solvents include xylene, toluene, methyl ethyl ketone, methyl isobutyl ketone, and hexane, and more specifically xylene and toluene. The concentration of the protective adhesive composition in solution is not critical and will depend on the solubility of the adhesive components, the method of application, and other factors. In general, the solution comprises 1 to about 50 wt. %, more specifically about 5 to about 20 wt. % of the composition, based on the total weight of the solution.

The solution for the protective adhesive layer can be applied to a surface of a conductive layer or a dielectric circuit substrate material (e.g., a prepreg or a B-staged material) by known methods in the art, for example by dip, spray, wash, printing or other suitable coating technique. If the solution exhibits phase separation during coating or drying, the uniformity can be improved by increasing the solution temperature. Where a solvent is present, the solution is allowed to dry under ambient conditions, or by forced or heated air, to form an adhesion promoting layer. The protective adhesive layer can be applied to provide a coating weight of about 2 grams per square meter ($g/m^2$ or "gsm") to about 15 $g/m^2$, specifically about 3 $g/m^2$ to about 12 $g/m^2$, more specifically 5 to 10 $g/m^2$. The protective adhesive layer can be uncured or partially cured in the drying process.

After application of the protective adhesive layer, the coated conductive layer or coated circuit substrate can be stored or used directly to form a circuit laminate. The laminate can be formed by means known in the art. In one embodiment, the lamination process entails placing one or more layers of coated or uncoated circuit substrate between one or two sheets of coated or uncoated conductive layers (provided that an adhesive layer is disposed between at least one conductive layer and at least one dielectric substrate layer). Lamination and curing can be by a one-step process, for example using a vacuum press, or by a multiple-step process. Particular lamination temperatures and pressures will depend upon the particular adhesive composition and the substrate composition, and are readily ascertainable by one of ordinary skill in the art without undue experimentation.

In accordance with various specific embodiments used in preparing a circuit subassembly, FIG. 1 shows an exemplary circuit laminate 10 comprising a protective adhesive layer 14 disposed between a dielectric circuit substrate 12 and a conductive layer 16, e.g., a copper foil. As used herein, "disposed" means at least partial direct contact, without any intervening layers, between conductive layer copper foil and the protective adhesive layer. It is to be understood that in all of the embodiments described herein, the various layers can fully or partially cover each other, and additional copper foil layers, patterned circuit layers, and dielectric layers can also be present.

Figure 2:
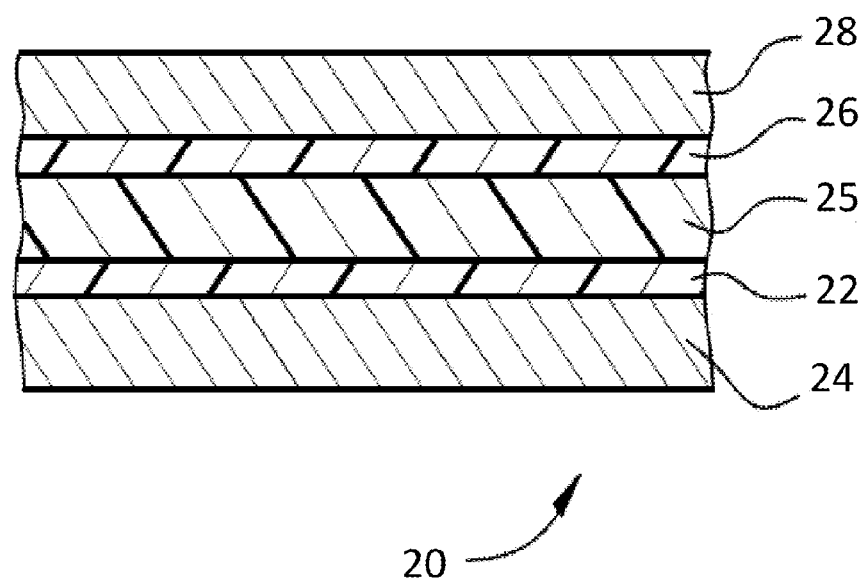
FIG. 2 shows an exemplary double clad circuit laminate comprising a dielectric layer, two adhesive protectivelayers, and two conductive layers.

FIG. 2 shows an exemplary double clad circuit laminate 20 comprising a first protective adhesive layer 22 disposed between a first conductive layer 24 and a first side of a dielectric circuit substrate 25. Second adhesive protective layer 26 is disposed between second conductive layer 28 and a second side of circuit substrate 25. The first and second adhesive layers 22, 26 can comprise the same or different polymer composition, and first and second conductive layers 24, 28 can comprise the same or different types of conductive layer, e.g. copper foil.

FIG. 3 shows an exemplary double clad circuit 30 comprising a first protective adhesive layer 32 disposed between a first conductive layer 34 and a first side of a dielectric circuit substrate 35. Second adhesive protective layer 36 is disposed between a patterned (e.g., etched) circuit layer 38 and a second side of dielectric circuit substrate 35. The first and second adhesive layers 32, 36 can comprise the same or different polymer composition.

FIG. 4 shows an exemplary circuit 40 comprising the circuit material 50 as described in FIG. 3. A bond ply 52 can be disposed on the side of the patterned circuit 48 opposite protective adhesive layer 46, and resin-coated conductive layer comprising a copper foil 54 disposed on bond ply 52 is disposed on a side opposite patterned circuit 48. Optionally, and as shown in FIG. 4, a third adhesive layer 56 is disposed between bond ply 52 and copper foil 54. The first, second, and third protective adhesive layers 42, 46, 56, can comprise the same or different polymer composition, and first and second conductive layers 44, 54 can comprise the same or different types of, e.g., copper foil.

Various multilayer circuits can be made by using a bond ply to bond multiple layers of circuit subassemblies into a single stacked circuit containing many circuitized conductive layers. Exemplary circuit subassemblies can include, without limitation, single clad laminates, double clad laminates, and the like. A single clad laminate, for example, comprises a conductive metal layer disposed on and in contact with a dielectric substrate layer. It is to be understood that in all of the embodiments described herein, the various layers can fully or partially cover each other, and additional conductive layers, patterned circuit layers, and dielectric layers can also be present. Optional adhesive layers (not shown) can also be present. A double clad circuit laminate comprises two conductive layers disposed on opposite sides of a dielectric substrate layer. One or both of the conductive layers can be in the form of a circuit.

Typically, circuit subassemblies comprising a bond ply can be formed by laminating two or more (patterned or unpatterned) single or double clad laminates together using one or more bond plies in proper alignment using heat and/or pressure. Patterning after lamination is another option. A single clad laminate can have a conductive layer fixedly bound to a dielectric substrate layer. A double clad laminate can have two conductive layers, one on each side of the substrate. Patterning a conductive layer, for example by etching, provides a circuit layer, and thus a circuit in a circuit laminate. (A circuit laminate is a single or double clad laminate that has one or more circuit layers. Thus, bond plies can be used to provide adhesion between various layers or laminates.

It is desirable that a bond ply is capable of withstanding the processing temperatures encountered during component mounting. One common requirement for "lead-free" soldering is that the multilayer assembly survives 10 minutes at a temperature of 288° C. without delamination. One material property that is often indicative of the ability to survive the 10 minutes at 288° C. is the "decomposition temperature," $T_d$. The decomposition temperature is measured using a thermogravimetric analyzer (TGA). The material to be tested is placed in the TGA and the temperature is increased at a rate of 10° C./minute. The $T_d$ is defined as the temperature at which the cumulative weight loss reaches 5%. In order to survive the 10 minutes at 288° C. delamination test, the $T_d$ needs to be greater than about 290° C. Bond plies can have a melting point between 250° C. and 370° C., a decomposition temperature greater than about 290° C. and a dissipation factor of less than 0.01 at 10 GHz.

In general, bond ply compositions can be processed as follows. First, all components (bond ply resins and optional additives) are thoroughly dissolved or suspended in solvent and cast onto glass fabric or onto a releasable substrate such as siliconized Mylar® polyester film. The mixing temperature is regulated to avoid substantial decomposition of the components. Mixing continues until resins and additives are uniformly dispersed throughout the composition. In one embodiment, a circuit assembly in accordance with the invention is manufactured by forming a stack comprising a bond ply layer disposed between one or more single or double clad circuit laminates, and laminating the multilayer stack. The bond ply layer can be formed from one or more bond plies or bond ply prepregs (i.e. materials pre-impregnated with other materials). (Similarly, the dielectric substrate layer can be formed from one or more dielectric substrate layers or prepregs.) Most commonly, at least one conductive layer of the single or double clad circuit laminate will be etched to provide a circuit in the subassembly comprising a bond ply. Suitable conditions for the lamination can be readily determined by one of ordinary skill in the art without undue experimentation using the guidance provided herein, and will depend on factors such as the softening or melt temperature of the resin and the thickness of the substrate. Exemplary conditions are 150-320° C., 50-500 pounds per square inch (psi) (0.345-3.45 MPa) for up to about three hours. Additional layers can be present, for example, additional conductive layers, substrates, bond ply layers and/or other layers, to make a circuit subassembly.

Figure 5:
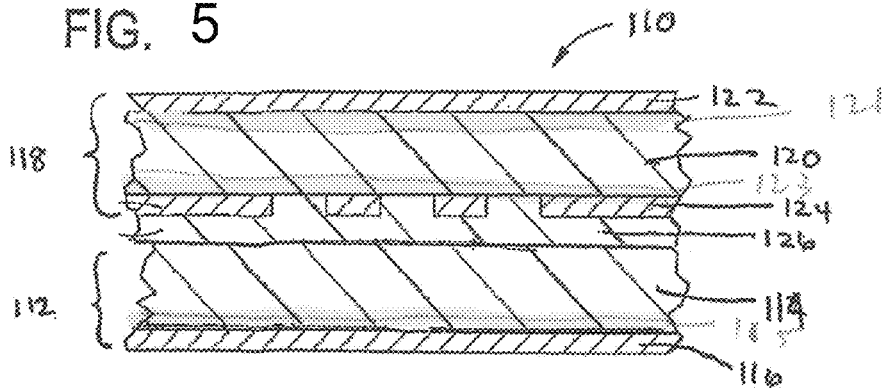
FIG. 5 shows an exemplary multilayer circuit comprising a single circuit layer constructed from a single clad laminate.

Many different multilayer circuit configurations can be formed using tie layers. An exemplary embodiment is shown in FIG. 5, wherein a circuit assembly 110 comprises a single clad laminate 112 comprising a dielectric layer 114 and a conductive layer 116, between which is protective adhesive layer 115, and a double clad laminate 118 comprising a dielectric layer 120 and a conductive layer 122, between which is protective adhesive layer 121, and (attached by a protective adhesive layer 123) a circuit layer 124, wherein at least one of the dielectric layers 114, 120 has the composition described herein. Bond ply layer 126 can be the thermosetting material also described herein. One or all of the dielectric layer 114, dielectric layer 120, and bond ply 126 can comprise a woven web (not shown).

Figure 6:
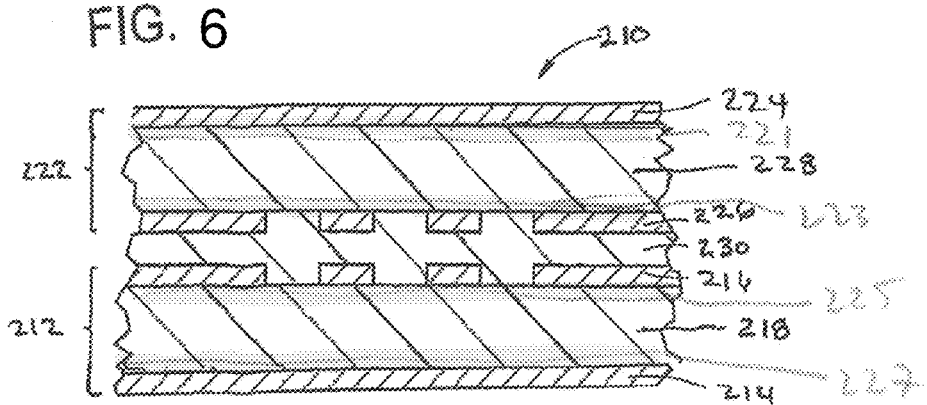
FIG. 6 shows an exemplary multilayer circuit comprising a two circuit layers constructed from two double clad laminates.

Another embodiment of a multilayer circuit assembly is shown at 210 in FIG. 6. Assembly 210 comprises a double clad circuit layer 212 comprising a conductive layer 214 and a circuit layer 216 on opposite sides of a dielectric substrate layer 218, and another double clad circuit layer 222 comprising a conductive layer 224 and a circuit layer 226 on opposite sides of a dielectric substrate layer 228, wherein at least one, and preferably both, of dielectric layers 218, 228 has the composition according to the present invention. Bond ply layer 230 is a thermoplastic or thermosetting material as described above. One or all of the dielectric layers 218, 228, and/or bond ply layer 230 can comprise a woven web and/or a particulate filler (not shown). One or both of conductive layers 214, 224 can be circuitized (not shown). Protective adhesive layers 221, 223, 225, and 227 are optionally disposed between each conductive layer or circuit and its dielectric substrate layer.

Figure 7:
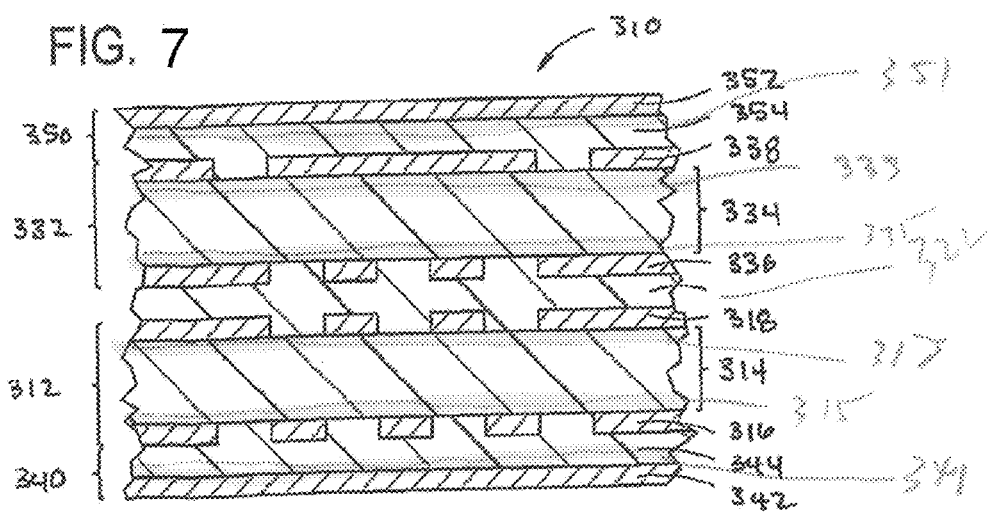
FIG. 7 shows an exemplary multilayer circuit comprising three circuit layers constructed from three double clad laminates.

FIG. 7 shows an exemplary circuit assembly 310 having a first double clad circuit 312, a second double clad circuit 332, and a bond ply 322. Double clad circuit 312 comprises a dielectric substrate 314 between two conductive circuit layers 316, 318. Double clad circuit 332 comprises a dielectric substrate 334 located between two conductive circuit layers 336, 338. At least one, and specifically both, of dielectric layers 314, 334 has the composition disclosed herein. Each dielectric substrate layer 314, 334 can comprise, in addition to particulate filler, a nonwoven glass reinforcement (not shown). Two cap layers, 340, 350 are also shown. Each cap layer 340, 350 includes a conductive layer 342, 352 over a bond ply layer 344, 354. Protective adhesive layers 351, 333, 335, 317, 315, and 341 are optionally disposed between each conductive layer or circuit and its dielectric substrate layer.

As mentioned above, such circuit subassemblies, which are essentially halogen-free, can provide circuit materials having numerous advantages. The subassemblies can have a UL94 rating of at least V-1 at a thickness of 40 mil and a UL94 V-0 rating at up to 60-mil thickness, without the use of halogenated flame retardants. In addition, they have low water absorption, generally less than about 0.5%, specifically less than about 0.3%. Resistance to the acids and other solutions used in circuit fabrication is high. In addition, electrical and thermal properties are consistent with those desired in circuits for high frequency and high data speed electrical and electronic applications, particularly a dissipation factor of less than about 0.006.

The invention is further illustrated by the following non-limiting Examples.

EXAMPLES

The materials listed in Table 1 were used in the following examples.

TABLE 1

| Material name | Chemical name |
|---|---|
| PB resin 1 | Vinyl-terminated oligomeric polybutadiene resin, vinyl content 88%, MW of 3000 Da (about 56 monomer units) |
| PB resin 2 | Vinyl-terminated oligomeric polybutadiene resin (about 56 monomer units) |
| PPO resin | Polyphenylene ether, vinyl terminated |
| Elastomer Resin | SB (styrene-butadiene) diblock copolymer (20%) and SBS triblock copolymer (80%) |
| TAIC | Triallyl cyanurate. CAS 101-37-1 |
| DOPO-containing aromatic compound | High melt diDOPO compound of predominantly structure (7) herein from Albermarle Corp. |
| Silane | Aminosilane |
| Reactive Monomer | Ethylene propylene dicyclopentadienene monomer liquid rubber |
| Silica 1 | Spherical fused silica. Particle size < 20 μm. |
| Silica 2 | Spherical fused silica. Particle size < 20 μm. |
| Silica 3 | Spherical fused silica. Particle size < 25 μm. |
| Titanium Oxide | Titanium oxide. Particle size 0.3 μm |
| AO | 2,2′-oxamidobis- [ethyl-3-(3,5-di-t- butyl-4-hydroxyphenyl) propionate], antioxidant for rubber. |
| Curing agent 1 | 2,3-Dimethyl-2,3-diphenylbutane curing agent, 350° F. onset cure temperature. |
| Curing agent 2 | Dialkyl peroxide. |
| Stabilizer | High molecular weight hindered amine light stabilizer (HALS). |
| Cu foil | High profile copper foil. |

The following examples demonstrate the advantages of specified dielectric substrate compositions comprising an oxaphosphorinoxide-containing aromatic compound.

Preparation:

In general, a dielectric subassembly is prepared as follows. The composition for the dielectric substrate of Example 1 comprises the components shown in a Table below. The composition for the protective adhesive layer is as described in U.S. Pat. No. 8,43,222 B2 to Paul, herein incorporated by reference in its entirety.

An exemplary circuit laminate is prepared as follows using a protective adhesive composition (as set forth in Table 2 below) disposed between the dielectric substrate and a copper foil. The protective adhesive composition contains 100 parts by weight of a maleinized poly(arylene ether) (10 wt. % solution in solvent having 98% toluene and 2% xylene), 0.5 parts by weight of Varox® peroxide cure initiator, and the indicated amount of functionalized polybutadiene polymer and elastomeric block copolymer. The protective adhesive composition is coated TWS® foil high profile circuit copper foil with an MS surface roughness of about 3 μm, as measured by the WYCO interferometer at a final target dry basis weight of approximately 8 grams/m² (gsm) (about 8 micrometers) using a #28 Mayer rod and allowed to air dry in a hood. The protective adhesive layer is applied to the copper foil using a slot die assembly.

Conventional dielectric substrate manufacturing methods are employed, specifically the composition of Example 1 (Table 2) is coated onto glass fabric and dried to make a 2-mil to 10-mil prepreg sheet. After the prepreg is plied up to a specific thickness, lamination is done employing heat/pressure with adhesive-coated copper on both sides of the prepreg to make a double clad laminate. In the examples, laminates ranging in thickness from 2-mil to 120-mil are prepared.

The laminate is densified and cured via flat-bed lamination; typical cure temperature ranges are between about 325° F. (163° C.) and 525° F. (246° C.) employing a pressure of about 300-1200 psi.

Testing:

Flame/flameout testing is performed according to Underwriter's Laboratory Method UL-94. A flame having an inner cone of height 1.9 cm (¾ inches) is applied to each specimen so that a distance of 1.0 cm (⅜ inch) separates the lower end of the specimen from base of the flame. The flame is held in that position for 10 seconds and then removed. A burn time $T_1$ is defined as the time required for the flame issuing from the specimen to disappear. If burning of the specimen ceases within a $T_1$ of 30 seconds, the flame is reapplied for an additional 10 seconds and a second burn time $T_2$ is determined. For a V-0 rating, no individual burn times, from the first or second application can exceed 10 seconds. The total of the burn times for any five specimens cannot exceed 50 seconds. Drip particles that ignite a piece of cotton gauze situated below the specimen are not allowed. For a V-1 rating, no individual burn times, from the first or second application can exceed 30 seconds. The total of the burn times for any five specimens cannot exceed 250 seconds. Drip particles that ignite a piece of cotton gauze situated below the specimen are not allowed. An F rating indicates flammable.

Water absorption is measured in accordance with the test method, IPC-TM-650 2.6.2.1 (conditioned in an environment maintained at 50% relative humidity and 22° C. for 1 hour (prior to soaking in water). Dielectric constant ($D_k$) and Dissipation Factor ($D_f$) are the averages of the measured dielectric constants and dissipation factors from 1-10 GHz frequency sweep.

Base resistance is measured using a base weight loss test as follows: 2-inch square laminate samples (2 pieces) are dried and conditioned in an environment maintained at 50% relative humidity and 72° F. for 1 hour. The weight of each conditioned sample is determined to the nearest 0.1 milligram. The conditioned samples are then submersed in a base solution containing 1 N sodium hydroxide at room temperature for 24-48 hours. At the end of the allotted time, the laminate samples are removed from base solution, washed thoroughly with water, dried, and conditioned. The weight of each conditioned sample is determined to the nearest 0.1 milligram. Percent base loss is calculated as follows:

$$\text{Base weight loss (\%)} = \frac{\text{Conditioned weight} - \text{Final weight}}{\text{Conditioned weight}} \times 100$$

Example 1

The circuit laminate of Example 1 consisted of a dielectric composition having the composition shown in Table 2 and a protective adhesive layer having the composition shown in Table 3.

TABLE 2

| | % total | % Dry | pph resin | Specific Gravity | Volume |
|---|---|---|---|---|---|
| Elastomer resin | 3.61 | 5.41 | 24.56 | 0.94 | 0.0576 |
| Silane | 0.65 | 0.97 | 4.40 | 1.044 | 0.0093 |
| AO | 0.04 | 0.06 | 0.27 | 1.12 | 0.0005 |
| Stabilizer | 0.14 | 0.21 | 0.97 | 1.04 | 0.0020 |
| Reactive monomer | 0.77 | 1.16 | 5.25 | 0.84 | 0.0138 |
| PB resin 1 | 10.31 | 15.47 | 70.19 | 0.97 | 0.1595 |
| DOPO compound | 15.47 | 23.22 | 105.31 | 1.52 | 0.1527 |
| Silica 1 | 22.47 | 33.73 | 152.98 | 2.2 | 0.1533 |
| Silica 2 | 11.24 | 16.87 | 76.51 | 2.2 | 0.767 |

TABLE 2-continued

| | % total | % Dry | pph resin | Specific Gravity | Volume |
|---|---|---|---|---|---|
| Titanium oxide | 1.42 | 2.13 | 9.65 | 4.1 | 0.0052 |
| Curing agent 1 | 0.51 | 0.77 | 3.49 | 1.1 | 0.0070 |
| Xylene | 33.37 | — | — | — | — |

TABLE 3

| Component | Parts |
|---|---|
| PPE-MA solution | 100 |
| Elastomer resin | 7.5 |
| PB resin 1 | 7.5 |
| Peroxide initiator | 0.5 |

Based on Table 2, it can be calculated that the weight percent resin is 18.65 percent. The weight percent phosphorous is 3.35% (based on 14.4 wt. % phosphorous in the DOPO compound), and the percent nitrogen (negligible) is 0.04%, based on 18.7 wt. % nitrogen in the amine hindered stabilizer. The volume percent inorganic filler is 36.88% and the volume percent resin is 36.21%. The volume percent of inorganic filler plus DOPO compound is 60.83%. The volume percent of the DOPO compound is 23.95%, and the volume ratio of filler to flame retardant is 154%.

Weight Loss after NaOH Exposure:

Testing for the weight loss after NaOH (caustic) exposure with and without the protective adhesive layer was conducted to determine the need to include the adhesive composition as a protective adhesive layer in the laminate composite. The tests was initially conducted on formulations which included higher amounts of the DOPO compound (30 wt. %) in combination with high amounts of melamine polyphosphate synergist (30 wt. %). Testing such formulation in a 0.020 inch laminate, the weight loss varied from 1.42% to 4.44% without the protective adhesive layer, which is undesirably high, as compared to 0.01% to 0.27 wt. % with the protective adhesive layer and as compared to a control (0.13%) without the DOPO compound. Although these initial formulations were superseded by the formulation of Table 1, Applicant was able to determine that the protective adhesive layer was necessary to prevent dissolution of the DOPO compound in caustic solution. Subsequent testing of a laminate containing the formulation of Table 2 for a 0.060 inch laminate resulted in a 0.23% weight loss after 42 hours of exposure to caustic solution. In a further test, a 0.27% weight loss was measured on a 0.060 inch sample, and a 0.40% weight loss was measured on a 0.020 inch sample after about 42 hours of exposure. Weight loss is expected to increase with longer exposure; the percentage change is expected to be higher the thinner the sample.

Water Absorption:

Water absorption on the formulation of Table 2 was 0.06% after 48 hours of exposure. In general, water absorption below about 0.15% is acceptable.

Electrical Properties:

A laminate using the formulation of Table 23 obtained electrical properties similar to a control using commercially available product RO4350B from World Properties, Inc. The $D_k$ was measured at 3.48 at 10 GHz and the $D_f$ at 0.0035 at 10 GHz for a sample laminate.

The above results for Example 1 demonstrate, in a circuit laminate, the effect of an effective amount of oxaphosphorinoxide-containing aromatic compound having a melting point greater than 280° C. In particular, base resistance was obtained using the protective adhesive layer.

Examples 2-4

In Examples 2 to 4, double clad laminates comprising various compositions for a dielectric substrate layer were made in which the amount of oxaphosphorinoxide-containing aromatic compound (in pphr, i.e., parts per hundred resin), the volume percent of inorganic filler, and the volume percent of inorganic filler plus DOPO compound were varied from the composition of Table 2 in Example 1. The volume percent of the DOPO compound was the same for Example 2, Comparative Example 3, and Comparative Example 4. The fire retardance (UL94) rating for laminates of various thicknesses were also tested. The results are shown in Table 4.

TABLE 4

| Example | FR pphr | FR volume % | Filler + FR volume % | Laminate thickness 10 mil | Laminate thickness 20 mil | Laminate thickness 30 mil | Laminate thickness 40 mil |
|---|---|---|---|---|---|---|---|
| 1 | 1.05 | 24.0 | 60.6 | V-0 | V-0 | NA | V-1 |
| 2 | 0.96 | 22.4 | 59.7 | V-0 | V-1 | NA | V-1 |
| C3 | 0.90 | 22.4 | 57.0 | V-0 | V-1 | V-1 | Fail |
| C4 | 0.86 | 22.4 | 55.0 | —* | Fail | —* | Fail |

*Not tested.

The results in Table 4 demonstrate that, for Comparative Examples C3 and C4, a dielectric composition having a volume percent of not greater than 55 percent, for inorganic filler plus DOPO compound, with a pphr of the DOPO compound less than 96, resulted in a UL94 rating less than V1 (Failure), compared to the oxaphosphorinoxide-containing composition of Examples 1 and 2. A V0 rating was obtained for a laminate less than 20 mil in Example 1, and a V0 or V1 rating was obtained for a laminate that was 20 to 40 mil in thickness, only when using a volume percent greater than 55 percent, specifically at least 57 percent, for inorganic filler plus fire retardant, and a pphr of the flame retardant greater than 95.

Thus, it was demonstrated that a dielectric layer having a specified volume percent, in total, of the oxaphosphorinoxide-containing aromatic compound and inorganic filler, can achieve a UL-94 rating of V0 employing a limited amount of oxaphosphorinoxide-containing aromatic compound, thereby not unduly and adversely affecting water absorption or electrical properties.

Example 5-14

Examples 5-14 demonstrates the performance of a bond ply according to another aspect of the present invention.

A bond ply having the composition set forth in Table 5 below was prepared. The resins, inorganic filler, and all other components are thoroughly mixed to form a slurry in conventional mixing equipment. The mixing temperature is regulated to avoid substantial decomposition of the curing agent (and thus premature cure).

TABLE 5

| Component | % Total | % Dry | Pphr | SG | Volume |
|---|---|---|---|---|---|
| Elastomer resin | 3.79 | 5.34 | 16.88 | 0.94 | 0.0568 |
| Silane | 0.20 | 0.28 | 0.87 | 1.044 | 0.0026 |
| Stabilizer | 0.22 | 0.31 | 0.97 | 1.04 | 0.0030 |
| Reactive monomer | 1.42 | 2.00 | 6.33 | 0.84 | 0.0238 |
| PB resin 1 | 8.52 | 12.01 | 37.97 | 0.97 | 0.0447 |
| TAIC | 3.32 | 4.67 | 14.77 | 1.044 | 0.0746 |
| PPO resin | 5.40 | 7.61 | 24.05 | 1.02 | 0.1975 |
| DOPO FR | 21.31 | 30.02 | 94.94 | 1.52 | 0.1377 |
| Silica 3 | 21.51 | 30.30 | 95.83 | 2.2 | 0.163 |
| Titanium oxide | 4.74 | 6.67 | 21.10 | 4.1 | 0.0163 |
| Curing agent 2 | 0.57 | 0.800 | 2.53 | 0.97 | 0.0083 |
| Xylene | 29.01 | — | — | — | — |

Based on the formulation of Table 5, it can be calculated that the percent weight resin is 31.6%, and the percent weight inorganic filler is 30.3%. The weight ratio of the polybutadiene resin to the poly(phenylene oxide) resin is 1.58. The volume percent of the filler is 22.4%, the volume percent resin is 47.0%, and the volume percent of the DOPO compound is 28.7%. The volume percent of inorganic filler plus DOPO compound is 51.0%. The volume percent of liquid resin is 27.9% (about 28%).

In Examples 5 to 14 of Table 6 below, compositions for the bond ply layer was varied (from the formulation of Example 14 in Table 5) with respect to the volume percent of liquid resin. In these examples, the liquid resin consisted of the polybutadiene resin, the reactive monomer (Trilene®) and the crosslinker (TAIC). Both polybutadiene resin B1000 and polybutadiene resin B3000 are liquid resins, wherein polybutadiene B1000 is a lower molecular weight version of B3000. During lamination of a circuit subassembly at 350° F. maximum, a fill and flow rank of 1-5 was determined based on the following scale: 1=poor, no flow; 1.5=poor, flow for resin only, 3=good flow for both resin and filler; 5=excellent flow for both resin and filler. The results are shown in Table 6.

TABLE 6

| Example | PB resin | TAIC - Y/N | Volume % liquid resin | Fill and Flow Rank | Pass/Fail |
|---|---|---|---|---|---|
| 5 | B1000 | N | 26 | 1.5 | F |
| 6 | B1000 | Y | 30 | 2.5 | P |
| 7 | B3000 | Y | 30 | 4 | P |
| 8 | B3000 | Y | 29 | 3 | P |
| 9 | B3000 | Y | 27 | 1.5 | F |
| 10 | B1000 | Y | 22 | 1 | F |
| 11 | B1000 | Y | 21 | 1 | F |
| 12 | B3000 | Y | 29 | 3.5 | P |
| 13 | B1000 | Y | 25 | 1 | F |
| 14 | B3000 | Y | 28 | 3 | P |

Fill and Flow Properties:

The results in Table 6 demonstrate that a volume percent of liquid resin of greater than 27 volume percent, as in Examples 6, 7, 8, 12, and 14, was necessary for good fill and flow, whereby both the inorganic filler and resin in the protective adhesive layer was evenly and homogenously distributed in the laminate. In contrast, the results for Comparative Examples 5, 9, 10, 11 show that a bond ply layer having a liquid resin not greater than 27 volume % resulted in a composition that failed in terms of fill and flow during lamination.

Bond Ply Flame Testing:

A bond ply according to the formulation of Table 5 above was found to contain the same level of flame retardant (measured in parts per hundred resin) as the laminate and to behave similarly. Two measurements were taken at about 0.020 inches and 0.060 inches and both tests showed the bond ply to have a UL 94 V-0 rating.

The singular forms "a," "an," and "the" include plural referents unless the context clearly dictates otherwise. The endpoints of all ranges directed to the same characteristic or component are independently combinable and inclusive of the recited endpoint. All references are incorporated herein by reference. As used herein and throughout, "disposed," "contacted," and variants thereof refers to the complete or partial physical contact between the respective materials, substrates, layers, films, and the like. Further, the terms "first," "second," and the like herein do not denote any order, quantity, or importance, but rather are used to distinguish one element from another.

While specific embodiments have been shown and described, various modifications and substitutions can be made thereto without departing from the spirit and scope of the invention. Accordingly, it is to be understood that the present invention has been described by way of illustration and not limitation.

What is claimed is:

1. A circuit subassembly, comprising a conductive metal layer;

a dielectric substrate layer formed from a thermosetting composition, wherein the thermosetting composition comprises:

a thermosetting resin having a limited oxygen index (LOI) of less than 20 and comprising at least two free-radically reactive functional groups;

greater than 95 parts per hundred resin of an oxaphosphorinoxide-containing aromatic compound having a peak melting point of at least about 260° C.; and 30 to 70 weight percent of inorganic filler, wherein the inorganic filler plus oxaphosphorinoxide-containing aromatic compound, in total, is present at 55 to less than 65 volume percent, based on the total volume of the thermosetting composition;

and a protective adhesive layer, having a thickness less than 20 percent of said dielectric layer, directly disposed between the conductive metal layer and the dielectric substrate layer, wherein the composition of the protective adhesive layer comprises less than 20 weight percent filler;

wherein the circuit subassembly has a UL-94 rating of at least V-1, a dissipation factor ($D_f$) of less than 0.006 at 10 GHz and a dielectric constant ($D_k$) of less than 3.8 at 10 GHz;

wherein the thermosetting resin is selected from the group consisting of 1,2-polybutadiene, polyisoprene, polybutadiene-polyisoprene copolymers, poly(phenylene ether) resins, curable cyclic olefins or their copolymers, and combinations thereof, and wherein the oxaphosphorinoxide-containing aromatic compound is represented by the following structure:

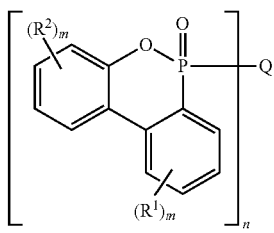

wherein each $R^1$ and $R^2$ independently represents hydrogen or a $C_1$-$C_6$ hydrocarbyl group, each m can independently represent an integer from 1 to 4, n is on average 2 to 4, and Q is a $C_2$-$C_{24}$ divalent or trivalent hydrocarbyl group.

2. The circuit subassembly of claim 1, wherein the protective adhesive layer comprises poly(arylene ether).

3. The circuit subassembly of claim 1 wherein the oxaphosphorinoxide-containing aromatic compound has the following structure:

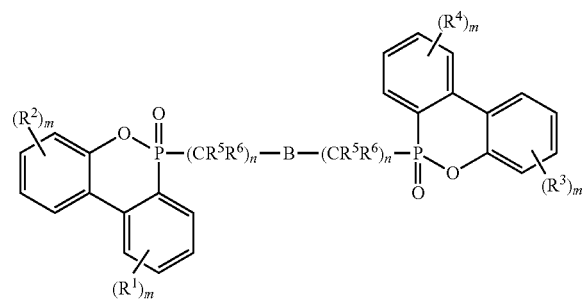

wherein B is a direct bond, $C_6$-$_{12}$ aryl, $C_3$-$C_{12}$ cycloalkyl, or a $C_3$-$C_{12}$ cycloalkenyl, wherein said cycloalkyl or cycloalkenyl may be optionally substituted by a $C_1$-$C_6$ alkyl; each $R^1$, $R^2$, $R^3$ and $R^4$ are independently hydrogen, $C_1$-$C_{15}$ alkyl, $C_6$-$C_{12}$ aryl, $C_7$-$C_{15}$ aralkyl or $C_7$-$C_{15}$ alkaryl; or $R^1$ and $R^2$ or $R^3$ and $R^4$ taken together can form a saturated or unsaturated cyclic ring, wherein said saturated or unsaturated cyclic ring may be optionally substituted by a $C_1$-$C_6$ alkyl; each m is independently 1, 2, 3 or 4; each $R^5$ and $R^6$ are independently hydrogen or a $C_1$-$C_6$ alkyl; and each n is independently 0, 1, 2, 3, 4 or 5; with the proviso that when A is aryl or a direct bond, n cannot be 0.

4. The circuit subassembly of claim 1 wherein the oxaphosphorinoxide-containing aromatic compound is selected from the group consisting of 6H-dibenz[c,e][1,2] oxaphosphorin, 6,6'-(1,4-ethanediyl)bis-, 6,6'-dioxide; 6H-dibenz[c,e][1,2] oxaphosphorin, 6,6'-(1,4-butanediyl)bis-, 6,6'-dioxide; 6H-dibenz[c,e][1,2] oxaphosphorin, 6,6'-(p-xylenediyl)bis-, 6,6'-dioxide, and combinations thereof.

5. The circuit subassembly of claim 1 wherein the oxaphosphorinoxide-containing aromatic compound has the following structure:

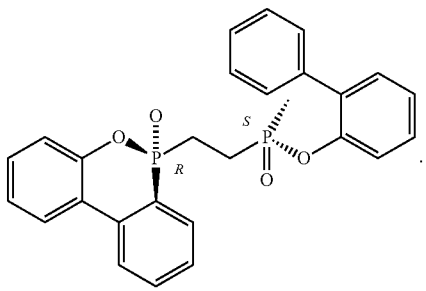

6. A printed wiring board formed from the circuit subassembly of claim 1.

7. A method for the manufacture of the circuit subassembly of claim 1, comprising laminating the conductive metal layer, the dielectric substrate layer, and the protective adhesive layer when present to provide the circuit subassembly.

8. A circuit subassembly, comprising
at least two circuit laminates, each comprising:
a conductive metal layer, wherein at least one of the conductive metal layers of each circuit laminate has been patterned to form a circuit;
a dielectric substrate layer formed from a thermosetting composition, wherein the thermosetting composition comprises:
a thermosetting resin having a limited oxygen index (LOI) of less than 20 and comprising at least two free-radically reactive functional groups;
greater than 95 parts per hundred resin of an oxaphosphorinoxide-containing aromatic compound having a peak melting point of at least about 260° C.; and
30 to 70 weight percent of inorganic filler, wherein the inorganic filler plus oxaphosphorinoxide-containing aromatic compound, in total, is present at 55 to less than 65 volume percent, based on the total volume of the thermosetting composition;
wherein each circuit laminate comprises a protective adhesive layer, having a thickness less than 15 percent of said dielectric layer, disposed between the conductive metal layer and the dielectric substrate layer; and
a bond ply layer disposed between the two circuit laminates wherein the bond ply is in direct contact with at least one circuit or conductive layer in at least one of the two circuit laminates, wherein the composition of the bond ply layer comprises said oxaphosphorinoxide-containing aromatic compound in an amount of 20 to 40 weight percent and inorganic filler in an amount that is 10 to 30 volume percent; and
wherein the circuit subassembly has a UL-94 rating of at least V-1, a dissipation factor ($D_f$) of less than 0.006 at 10 GHz and a dielectric constant ($D_k$) of less than 3.8 at 10 GHz.

9. The circuit subassembly of claim 8, wherein the composition of the bond ply comprises a nitrogen-containing compound in an amount of 1 to 10 weight percent.

10. The circuit subassembly of claim 9, wherein the nitrogen-containing compound contains a triazine ring and have allyl groups that are reactive with polybutadiene and/or polyisoprene resin in the bond ply layer.

11. The circuit subassembly of claim 8, wherein the composition of the dielectric substrate layer comprises less than ten weight percent of a nitrogen-containing compound.

12. The circuit subassembly of claim 8, wherein the bond ply layer and the protective adhesive layer each comprise at least 5 weight percent poly(arylene ether).

13. The circuit subassembly of claim 8, wherein the thermosetting resin is selected from the group consisting of 1,2-polybutadiene, polyisoprene, polybutadiene-polyisoprene copolymers, poly(phenylene ether) resins, curable cyclic olefins or their copolymers, and combinations thereof, and wherein the oxaphosphorinoxide-containing aromatic compound is represented by the following structure:

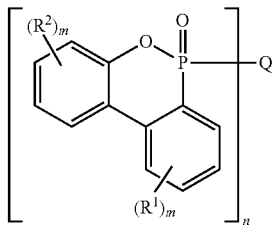

wherein each $R^1$ and $R^2$ independently represents hydrogen or a $C_1$-$C_6$ hydrocarbyl group, each m can independently represent an integer from 1 to 4, n is on average 2 to 4, and Q is a $C_2$-$C_{24}$ divalent or trivalent hydrocarbyl group.

14. The circuit subassembly of claim 8, wherein the protective adhesive layer and bond ply both comprise poly(arylene ether).

15. The circuit assembly of claim 8, wherein the A-bond ply layer has a thickness of 50 to 400 micrometers and the composition of the bond ply layer comprises:
greater than 27 volume percent of resin that is liquid at room temperature.

16. The circuit assembly of claim 15, wherein the oxaphosphorinoxide-containing aromatic compound in the bond ply layer is represented by the following structure:

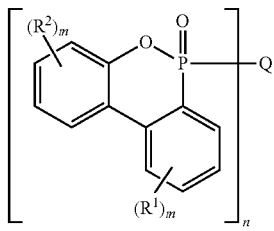

wherein each $R^1$ and $R^2$ independently represents hydrogen or a $C_1$-$C_6$ hydrocarbyl group, each m can independently represent an integer from 1 to 4, n is on average 2 to 4, and Q is a $C_2$-$C_{24}$ divalent or trivalent hydrocarbyl group.

17. A circuit subassembly, comprising
a conductive metal layer having a root mean square (RMS) surface roughness that is greater than about 1 micrometers;
a dielectric substrate layer formed from a thermosetting composition, wherein the thermosetting composition comprises:
a polybutadiene or polyisoprene resin in an amount of about 10 to about 55 wt. % of the total resin;
greater than 95 parts per hundred resin of an oxaphosphorinoxide-containing aromatic compound having a peak melting point of at least about 260° C., represented by the following structure:

(4)

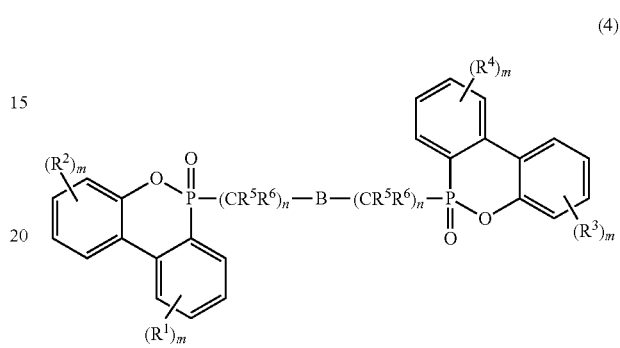

wherein B is a direct bond, $C_6$-$_{12}$ aryl, $C_3$-$C_{12}$ cycloalkyl, or a $C_3$-$C_{12}$ cycloalkenyl, wherein said cycloalkyl or cycloalkenyl may be optionally substituted by a $C_1$-$C_6$ alkyl; each $R^1$, $R^2$, $R^3$ and $R^4$ are independently hydrogen, $C_1$-$C_{15}$ alkyl, $C_6$-$C_{12}$ aryl, $C_7$-$C_{15}$ aralkyl or $C_7$-$C_{15}$ alkaryl; or $R^1$ and $R^2$ or $R^3$ and $R^4$ taken together can form a saturated or unsaturated cyclic ring, wherein said saturated or unsaturated cyclic ring can be optionally substituted by a $C_1$-$C_6$ alkyl; each m is independently 1, 2, 3 or 4; each $R^5$ and $R^6$ are independently hydrogen or a $C_1$-$C_6$ alkyl; and each n is independently 0, 1, 2, 3, 4 or 5; with the proviso that when B is aryl or a direct bond, n cannot be 0; and
30 to 70 weight percent of inorganic filler, wherein the inorganic filler plus oxaphosphorinoxide-containing aromatic compound, in total, is present at 55 to less than 65 volume percent, based on the total volume of the thermosetting composition;
and a protective adhesive layer, directly disposed between the conductive metal layer and the dielectric substrate layer, having a thickness less than 20 percent of said dielectric layer, wherein the composition of the protective adhesive layer comprises poly(phenylene ether) and 0 to 10 weight percent filler;
wherein the circuit subassembly has a UL-94 rating of at least V-1, a dissipation factor ($D_f$) of less than 0.006 at 10 GHz and a dielectric constant ($D_k$) of less than 3.8 at 10 GHz.

* * * * *